(12) United States Patent
Kim et al.

(10) Patent No.: US 12,342,712 B2
(45) Date of Patent: Jun. 24, 2025

(54) DISPLAY DEVICE AND METHOD FOR MANUFACTURING THE SAME

(71) Applicant: SAMSUNG DISPLAY CO., LTD., Yongin-si (KR)

(72) Inventors: Sunghoon Kim, Asan-si (KR); Yuri Kim, Guri-si (KR); Kang-Woo Lee, Seoul (KR); Seongjin Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 375 days.

(21) Appl. No.: 17/652,809

(22) Filed: Feb. 28, 2022

(65) Prior Publication Data
US 2022/0376201 A1   Nov. 24, 2022

(30) Foreign Application Priority Data

May 20, 2021  (KR) .................. 10-2021-0064577

(51) Int. Cl.
*H10K 77/10* (2023.01)
*H10K 50/84* (2023.01)
(Continued)

(52) U.S. Cl.
CPC ......... *H10K 77/111* (2023.02); *H10K 50/841* (2023.02); *H10K 59/871* (2023.02);
(Continued)

(58) Field of Classification Search
CPC ...... H10K 50/841; H10K 71/00; H10K 50/86; H10K 59/00; H10K 2102/311;
(Continued)

(56) References Cited

U.S. PATENT DOCUMENTS 8,845,916 B2   9/2014  Shin
9,354,476 B2   5/2016  Han et al.
(Continued)

FOREIGN PATENT DOCUMENTS

KR   10-2009-0033813 A   4/2009
KR   10-2009-00331813     4/2009
(Continued)

OTHER PUBLICATIONS

Translation to English of KR 20180079093 A via espacenet. accessed Aug. 14, 2024 (Year: 2018).*

(Continued)

*Primary Examiner* — Zachary M Davis
(74) *Attorney, Agent, or Firm* — F. CHAU & ASSOCIATES, LLC

(57) ABSTRACT

A display device includes a folding area foldable about a folding axis and a non-folding area proximate to the folding area. The display device includes a display module that displays an image and a glass window that is disposed over the display module that includes a patterned glass. The patterned glass includes a pattern portion including a groove pattern provided on one surface of the patterned glass to correspond to the folding area and a non-pattern portion disposed adjacent to the pattern portion to correspond to the folding area. The pattern portion has a thickness that is smaller than or equal to one-half a thickness of the non-pattern portion.

14 Claims, 29 Drawing Sheets

(51) Int. Cl.
  *H10K 59/80* (2023.01)
  *H10K 71/00* (2023.01)
  *H10K 50/86* (2023.01)
  *H10K 59/00* (2023.01)
  *H10K 102/00* (2023.01)

(52) U.S. Cl.
  CPC .............. *H10K 71/00* (2023.02); *H10K 50/86* (2023.02); *H10K 59/00* (2023.02); *H10K 59/8791* (2023.02); *H10K 2102/311* (2023.02)

(58) Field of Classification Search
  CPC .............. H10K 59/8791; H10K 59/871; H10K 77/111; G09F 9/301; C03C 15/00; C03C 33/0222; C03C 23/0025; D28D 1/003; B32B 3/30; B32B 5/145
  See application file for complete search history.

(56) References Cited

U.S. PATENT DOCUMENTS

| | | | |
|---|---|---|---|
| 9,655,235 B2 | 5/2017 | Hwang et al. | |
| 10,314,184 B2 | 6/2019 | Choi et al. | |
| 10,845,848 B2 | 11/2020 | Jones et al. | |
| 10,948,630 B2 | 3/2021 | Kim et al. | |
| 2016/0014881 A1* | 1/2016 | Shin | G06F 1/1616 |
| | | | 361/749 |
| 2018/0149793 A1 | 5/2018 | Gollier et al. | |
| 2018/0217639 A1* | 8/2018 | Jones | G06F 1/1618 |
| 2019/0334114 A1* | 10/2019 | Park | H05K 5/0226 |
| 2020/0009691 A1 | 1/2020 | Ostholt et al. | |
| 2020/0292731 A1* | 9/2020 | Park | G06F 1/1641 |
| 2021/0191467 A1 | 6/2021 | Sunwoo et al. | |
| 2021/0315116 A1* | 10/2021 | Sunwoo | B32B 27/38 |
| 2022/0209165 A1* | 6/2022 | Hyun | H10K 50/841 |

FOREIGN PATENT DOCUMENTS

| | | | | |
|---|---|---|---|---|
| KR | 10-2014-0015881 A | | 2/2014 | |
| KR | 10-2015-0017819 | | 2/2015 | |
| KR | 10-2018-0008723 | | 1/2018 | |
| KR | 10-2018-0057814 A | | 5/2018 | |
| KR | 20180079093 A | * | 7/2018 | |
| KR | 10-2019-0116378 | | 10/2019 | |
| KR | 10-2146730 | | 8/2020 | |
| KR | 10-2167404 | | 10/2020 | |
| KR | 10-2022-0006672 | | 1/2022 | |

OTHER PUBLICATIONS

Wansun Kim, et al., "Controlled Multiple Neutral Planes by Low Elastic Modulus Adhesive for Flexible Organic Photovoltaics," Nanotechnology 28 (2017) 194000 (9 Pages).

* cited by examiner

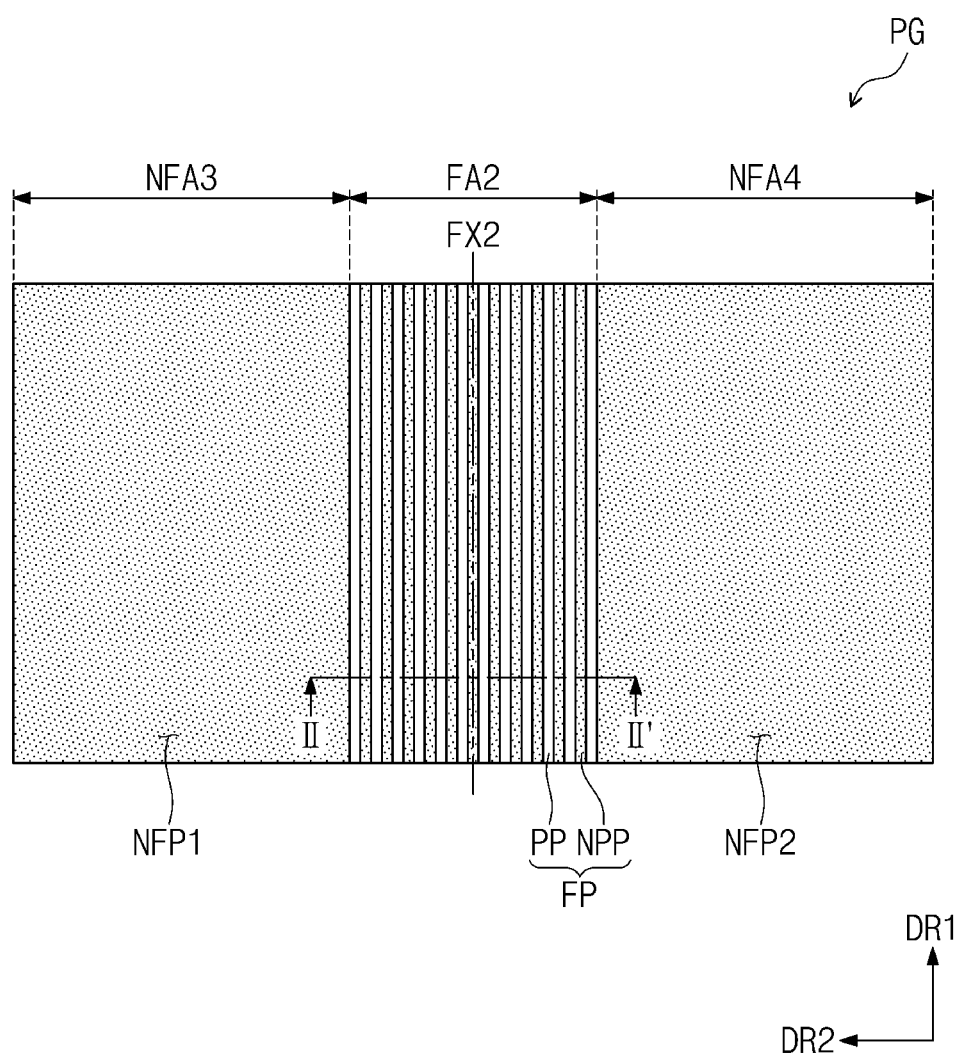

DISPLAY DEVICE AND METHOD FOR MANUFACTURING THE SAME

CROSS-REFERENCE TO RELATED APPLICATIONS

This application claims priority under 35 U.S.C. § 119 to Korean Patent Application No. 10-2021-0064577 filed on May 20, 2021, in the Korean Intellectual Property Office, the disclosure of which is herein incorporated by reference in their entirety.

TECHNICAL FIELD

The present disclosure relates to a display device and, more specifically, to a foldable display device and a method for manufacturing the same.

DISCUSSION OF THE RELATED ART

A display device provides information to a user by displaying various images on a display screen. To protect the display device and to provide a clear image, the display device may incorporate a glass window.

Recently, flexible display devices including a foldable flexible display panel have been developed. Unlike rigid display devices, the flexible display devices are foldable, rollable, or bendable. While some foldable flexible display panels utilize a screen that is non-glass, e.g., plastic, other flexible foldable display panels incorporate the use of glass to provide a desired level of image clarity and scratch/impact resistance.

SUMMARY

A display device includes a folding area that is foldable about a folding axis and a non-folding area proximate to the folding area. The display device includes a display module that displays an image and a glass window that is disposed over the display module. The glass window includes a patterned glass.

The patterned glass includes a pattern portion including a groove pattern provided on one surface of the patterned glass corresponding to the folding area and a non-pattern portion disposed proximate to the pattern portion and corresponding to the folding area. The pattern portion has a thickness that is smaller than or equal to one-half a thickness of the non-pattern portion.

A method for manufacturing a display device including a folding area that is foldable about a folding axis and a non-folding area proximate to the folding area includes manufacturing a display panel that displays an image, manufacturing a glass window, and combining the display panel and the glass window.

The manufacturing of the glass window includes forming laser patterns by applying an ultrashort pulse laser to one surface of a base glass corresponding to the folding area and forming a patterned glass including a pattern portion having a groove pattern and a non-pattern portion proximate to the pattern portion by etching the base glass having the laser patterns formed therein. The pattern portion is formed to have a thickness that is smaller than or equal to one-half a thickness of the non-pattern portion.

BRIEF DESCRIPTION OF THE FIGURES

The above and other objects and features of the present disclosure will become apparent by describing in detail embodiments thereof with reference to the accompanying drawings, in which:

FIG. 6 is a plan view of a patterned glass according to an embodiment of the present disclosure;

DETAILED DESCRIPTION

Figure 1:
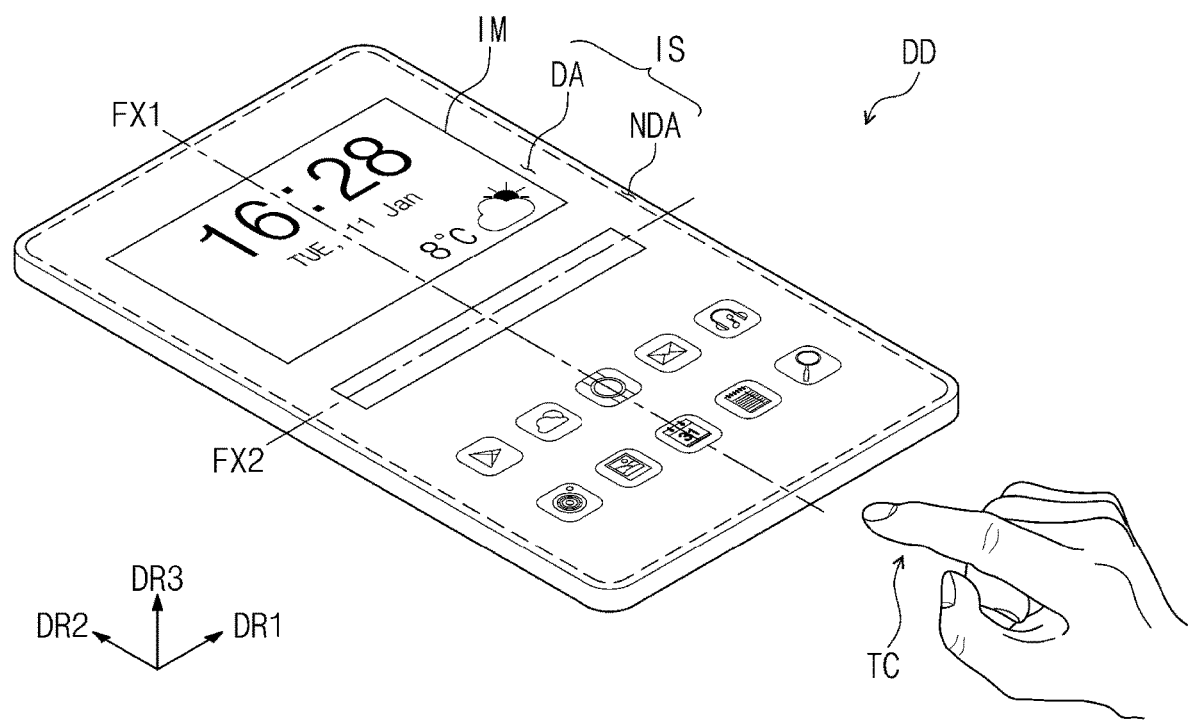
FIG. 1 is a perspective view of a display device according to an embodiment of the present disclosure.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals may refer to identical or similar components throughout the specification and the drawings. Additionally, in the drawings, the thicknesses, proportions, and dimensions of components may be exaggerated for effective description. As used herein, the term "and/or" includes all of one or more combinations defined by related components.

Terms such as first, second, and the like may be used to describe various components, but the components should not necessarily be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the present disclosure will be described with reference to the accompanying drawings.

FIG. 1 is a perspective view of a display device according to an embodiment of the present disclosure.

Referring to FIG. 1, the display device DD may be driven by an electrical signal. The display device DD may include various embodiments. For example, the display device DD may be used not only for large electronic devices, such as a television, a computer monitor, and outdoor signage, but also for small and medium-sized electronic devices, such as a laptop computer, a notebook computer, a personal digital assistant, an automobile navigation unit, a portable game console, a portable electronic device, and a camera. In this embodiment, it is exemplified that the display device DD is a smartphone.

The display device DD may a substantially rectangular shape with short sides extending in a first direction DR1 and long sides extending in a second direction DR2 intersecting the first direction DR1. However, the shape of the display device DD is not necessarily limited thereto, and the display device DD may have various shapes.

The display device DD may be a foldable electronic device. For example, the display device DD, according to an embodiment of the present disclosure, may be folded about a folding axis extending in a predetermined direction. Hereinafter, a state in which the display device DD is flat without being folded is defined as a first state (for example, a flat state), and a state in which the display device DD is folded about the folding axis is defined as a second state (for example, a folded state). The folding axis may be an axis of rotation about which the display device DD is folded and may be formed by a mechanical structure of the display device DD.

The folding axis may extend either in the first direction DR1 or the second direction DR2. In an embodiment of the present disclosure, a folding axis extending in the second direction DR2 is defined as a first folding axis FX1, and a folding axis extending in the first direction DR1 is defined as a second folding axis FX2. The display device DD may include either the first folding axis FX1 or the seconding folding axis FX2. For example, the display device DD may be folded about one of the first folding axis FX1 and the seconding folding axis FX2.

As illustrated in FIG. 1, the display device DD may display images IM on a display surface IS that extends in the first direction DR1 and the second direction DR2. The display surface IS on which the images IM are displayed may correspond to a front surface of the display device DD. A direction perpendicular to the display surface IS, for example, a thickness direction of the display device DD may be referred to as a third direction DR3. The display device DD may display the images IM in the third direction DR3.

The display surface IS of the display device DD may be divided into a plurality of areas. For example, display area DA and a non-display area NDA may be defined on the display surface IS of the display device DD.

The display area DA may be an area on which the images IM are displayed, and a user visually recognizes the images IM through the display area DA. The display area DA may have a quadrilateral shape. The non-display area NDA is an area proximate to the display area DA. For example, the non-display area NDA may at least partially surround the display area DA. The non-display area NDA is an area on which the images IM are not displayed. A bezel area of the display device DD may be defined by the non-display area NDA. In an embodiment of the present disclosure, the non-display area NDA may entirely surround the display area DA. Accordingly, the shape of the display area DA may be substantially defined by the non-display area NDA. However, this is illustrative, and the non-display area NDA may be disposed adjacent to only one or two sides of the display area DA. Alternatively, the non-display area NDA may be omitted.

The display device DD, according to the present disclosure, may sense the user's input TC applied from the outside (e.g., by a touch). The user's input TC includes various forms of external inputs such as a part of the user's body, light, heat, pressure, and the like. In this embodiment, the user's input TC is illustrated as the user's hand applied to the front surface of the display device DD. However, this is illustrative, and the user's input TC may be provided in various forms as described above. Furthermore, the display device DD may sense the user's input TC applied to a side surface or a rear surface of the display device DD depending on the structure of the display device DD, but the present invention is not necessarily limited to any one embodiment.

The display device DD may sense the user's input TC at the same time as displaying the images IM by activating the display surface IS. In this embodiment, an area for sensing the user's input TC is illustrated as being provided in the display area DA on which the images IM are displayed. However, this is illustrative, and the area for sensing the user's input TC may be provided in the non-display area NDA, or may be provided in all the areas of the display surface IS.

Figure 2A:
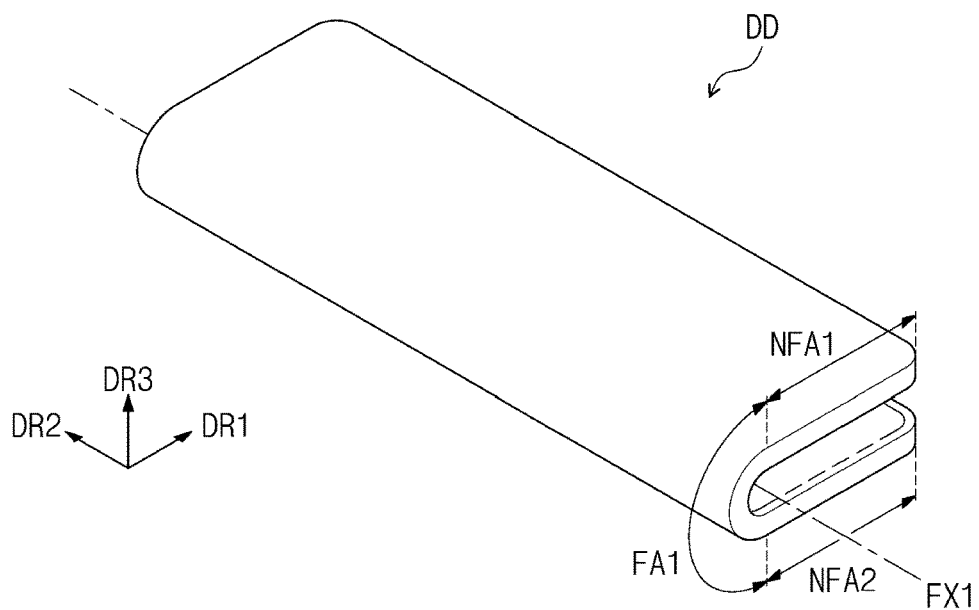
FIG. 2A is a view illustrating a folded state of the display device illustrated in FIG. 1 in which the display device is folded about a first folding axis in an in-folding manner.
Figure 2B:
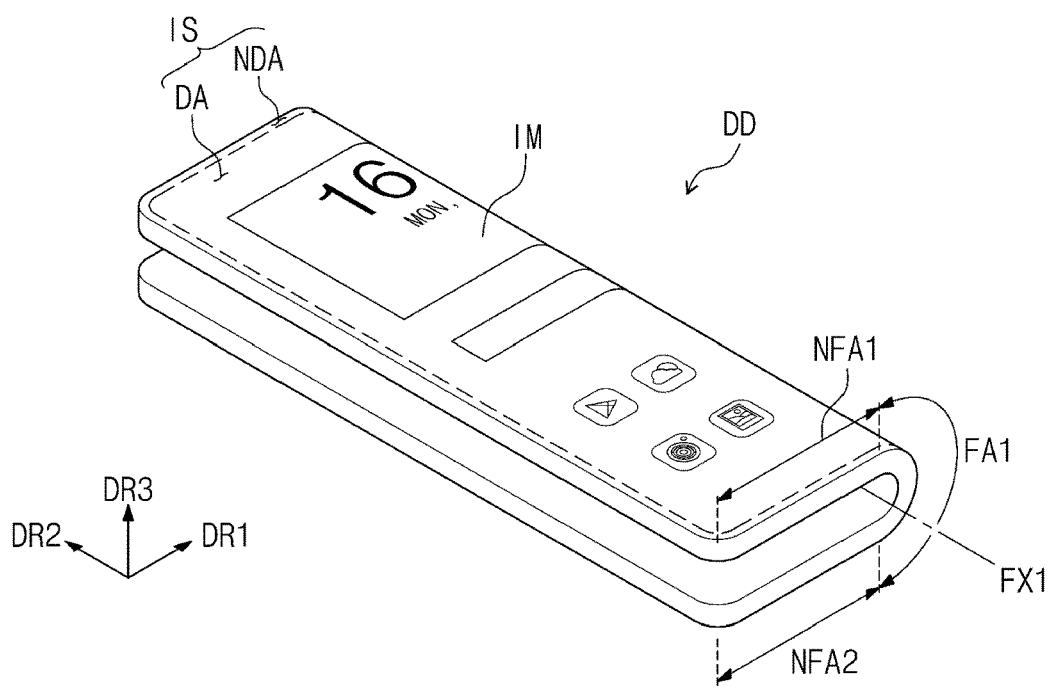
FIG. 2B is a view illustrating a folded state of the display device illustrated in FIG. 1 in which the display device is folded about the first folding axis in an out-folding manner.

FIG. 2A is a view illustrating a state in which the display device DD illustrated in FIG. 1 is folded about the first folding axis FX1 in an in-folding manner, and FIG. 2B is a view illustrating a state in which the display device DD illustrated in FIG. 1 is folded about the first folding axis FX1 in an out-folding manner. As used herein, the phrase "in-folded" means that two portions of the display surface IS face one another (thereby protecting the display surface IS) and the phrase "out-folded" means that two portions of the display surface IS face away from one another (thereby allowing the display surface IS to be seen).

Referring to FIGS. 1 and 2A, the display device DD may be a foldable display device. The display device DD may be folded about a folding axis (e.g., the first folding axis FX1 or the second folding axis FX2).

A plurality of areas may be defined in the display device DD depending on an operation type. The plurality of areas may include a folding area FA1 and one or more non-folding areas NFA1 and NFA2. The folding area FA1 is defined between the two non-folding areas NFA1 and NFA2.

The folding area FA1 is folded about the first folding axis FX1 and substantially forms a curvature. Here, the first folding axis FX1 may extend in the second direction DR2, for example, in the direction of the long axis of the display device DD. The folding area FA1 is defined as an area that is folded about the first folding axis FX1 and that extends in the second direction DR2.

In an embodiment of the present disclosure, the non-folding areas NFA1 and NFA2 may include the first non-folding area NFA1 and the second non-folding area NFA2. The first non-folding area NFA1 is adjacent to one side of the folding area FA1 in the first direction DR1, and the second non-folding area NFA2 is adjacent to an opposite side of the folding area FA1 in the first direction DR1.

The display device DD may be folded in an in-folding or out-folding manner. When folded in the in-folding manner, display surfaces of the first and second non-folding areas NFA1 and NFA2 face each other, and when folded in the out-folding manner, the display surfaces of the first and second non-folding areas NFA1 and NFA2 are exposed to the outside.

The display device DD illustrated in FIG. 2A may be folded in the in-folding manner such that the display surface IS of the first non-folding area NFA1 and the display surface IS of the second non-folding area NFA2 face each other. As the first non-folding area NFA1 is rotated about the first folding axis FX1 in a clockwise direction, the display device DD may be folded in the in-folding manner. To fold the display device DD in the in-folding manner such that the first non-folding area NFA1 and the second non-folding area NFA2 are aligned with each other, the first folding axis FX1 may be defined in the center of the display device DD in the first direction DR1. However, the first folding axis FX1 need not be disposed in the middle of the display device DD and thus, even when folded in an in-folded manner, there may be a portion of the display surface IS that remains visible as it is not overlapped.

Referring to FIG. 2B, the display device DD may be folded about the first folding axis FX1 in the out-folding manner. The display device DD may display the images IM when the display surface of the first non-folding area NFA1 and the display surface of the second non-folding area NFA2 are exposed to the outside. In addition, the display surface of the folding area FA1 exposed to the outside may also display the images IM. As illustrated in FIG. 1, the display device DD may display the images IM in the flat state. The first non-folding area NFA1, the second non-folding area NFA2, and the folding area FA1 may individually display images that provide independent information (e.g., two distinct images may be displayed side-by-side), or may display portions of one image that provides one piece of information (e.g., one single image is displayed with half of the image being displayed on each side).

The display device DD may be manufactured to have both an in-folded state and an out-folded state, or may be manufactured to have only one of an in-folded state and an out-folded state.

Figure 3A:
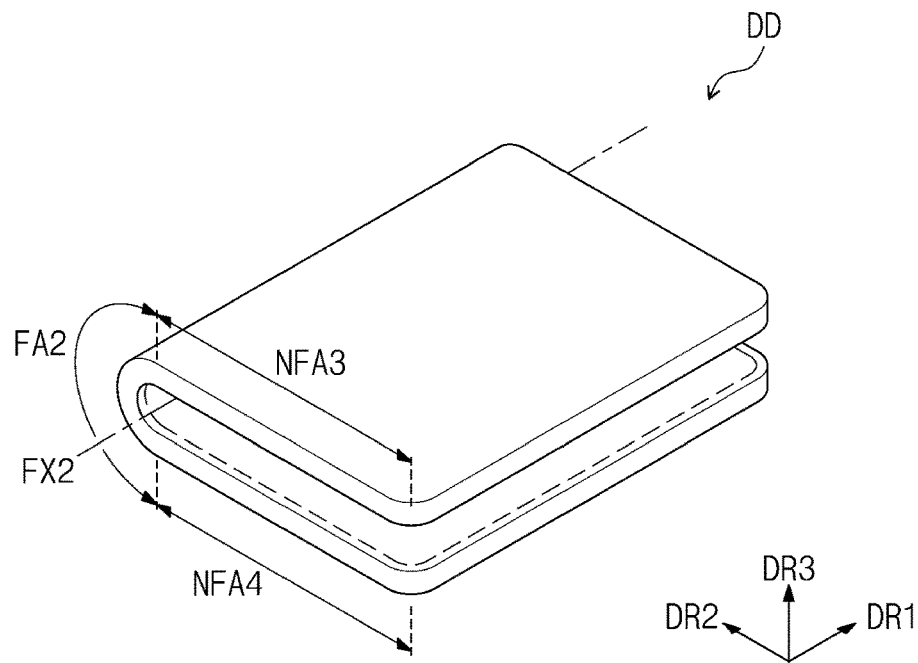
FIG. 3A is a view illustrating a folded state of the display device in which the display device illustrated in FIG. 1 is folded about a second folding axis in an in-folding manner.
Figure 3B:
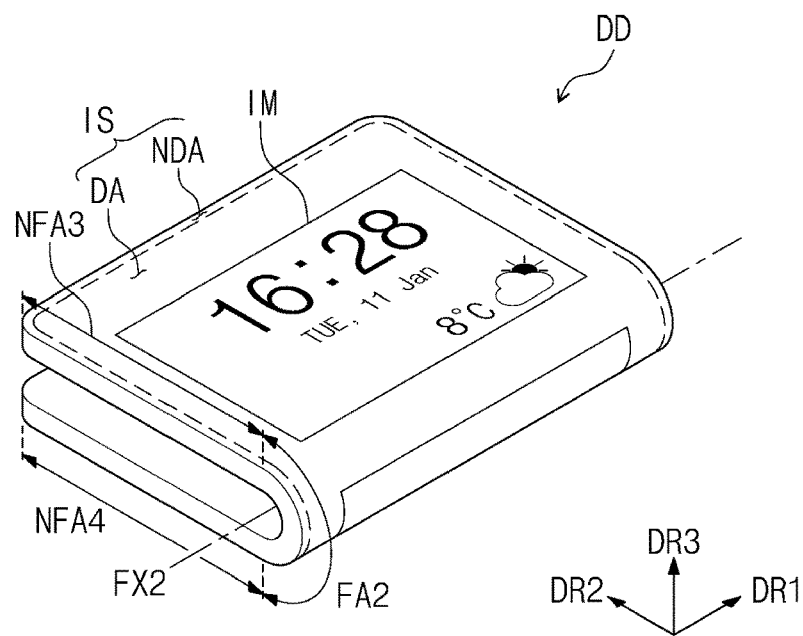
FIG. 3B is a view illustrating a folded state of the display device in which the display device illustrated in FIG. 1 is folded about the second folding axis in an out-folding manner.

FIG. 3A is a view illustrating a state in which the display device DD illustrated in FIG. 1 is folded about the second folding axis FX2 in an in-folding manner, and FIG. 3B is a view illustrating a state in which the display device DD illustrated in FIG. 1 is folded about the second folding axis FX2 in an out-folding manner.

Referring to FIGS. 3A and 3B, the display device DD may be folded about the second folding axis FX2 in an in-folding or out-folding manner. The second folding axis FX2 may extend in the first direction DR1, for example, in the direction of the short axis of the display device DD.

A plurality of areas may be defined in the display device DD depending on an operation type. The plurality of areas may include a folding area FA2 and one or more non-folding areas NFA3 and NFA4. The folding area FA2 is defined between the two non-folding areas NFA3 and NFA4.

The folding area FA2 is folded about the second folding axis FX2 and substantially forms a curvature. The folding area FA2 is defined as an area that is folded about the second folding axis FX2 and that extends in the first direction DR1.

In an embodiment of the present disclosure, the non-folding areas NFA3 and NFA4 may include the first non-folding area NFA3 and the second non-folding area NFA4. The first non-folding area NFA3 is adjacent to one side of the folding area FA2 in the second direction DR2, and the second non-folding area NFA4 is adjacent to an opposite side of the folding area FA2 in the second direction DR2.

In this embodiment, one folding area FA1 or FA2 is defined in the display device DD. However, the present disclosure is not necessarily limited thereto. According to an embodiment of the present disclosure, a plurality of folding areas may be defined in the display device DD.

Figure 4:
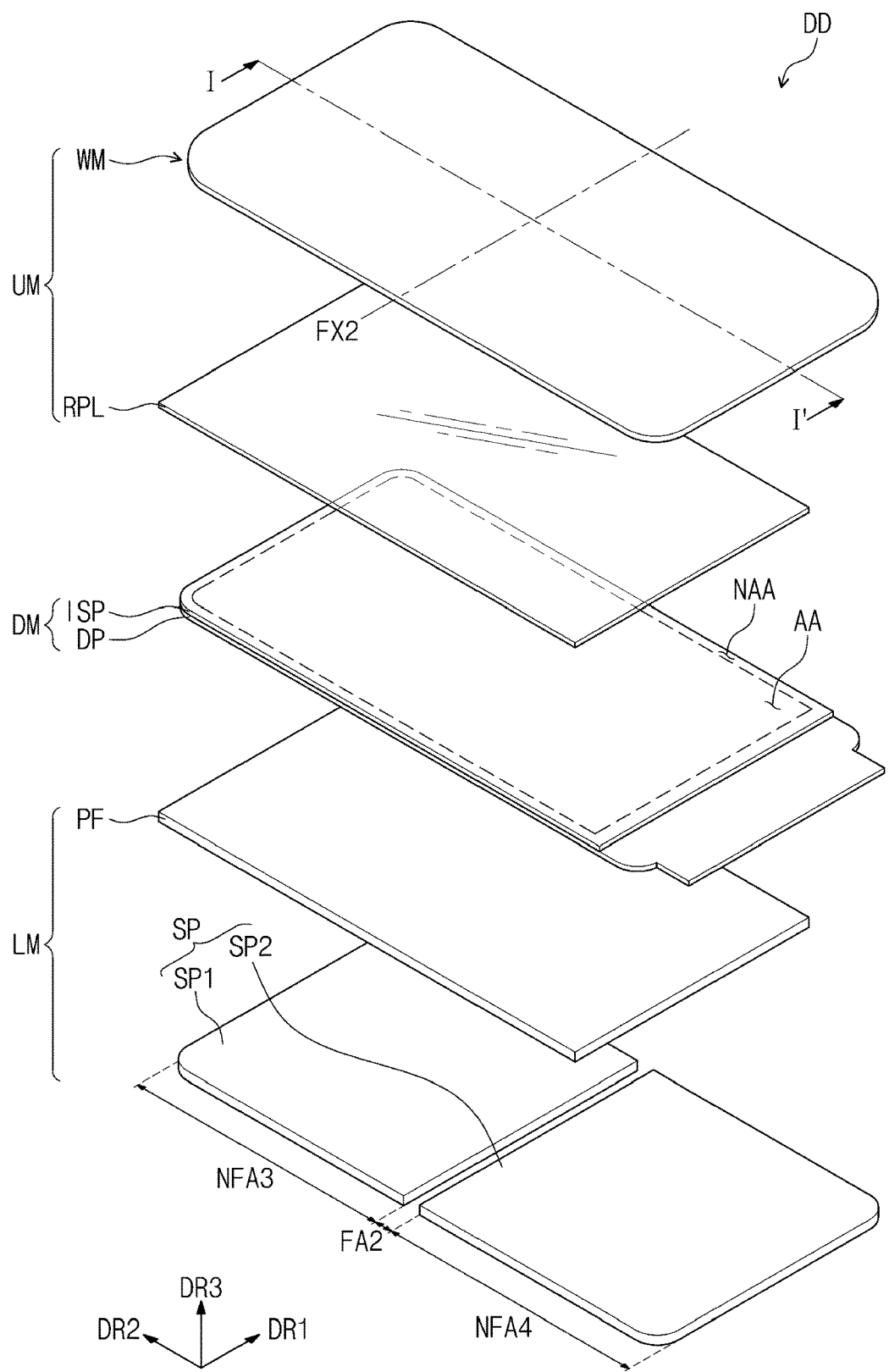
FIG. 4 is an exploded perspective view of the display device according to an embodiment of the present disclosure.
Figure 5A:
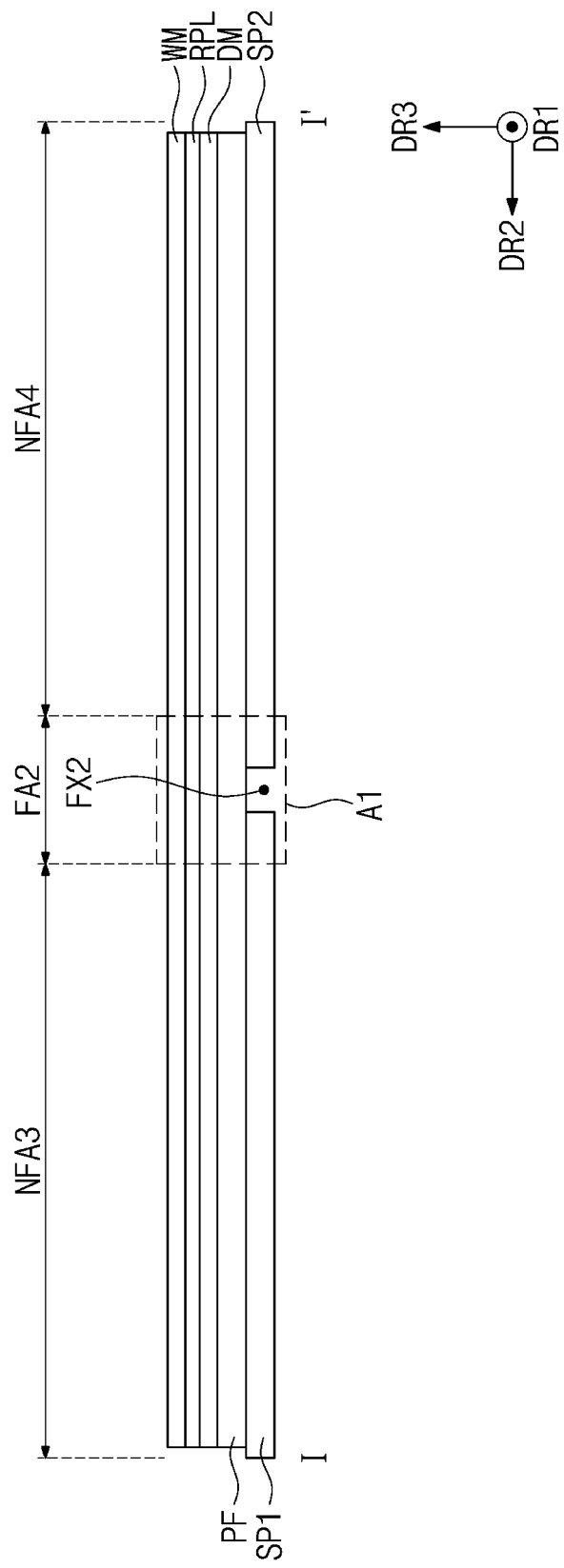
FIG. 5A is a cross-sectional view of the display device taken along line I-I' illustrated in FIG. 4.
Figure 5B:
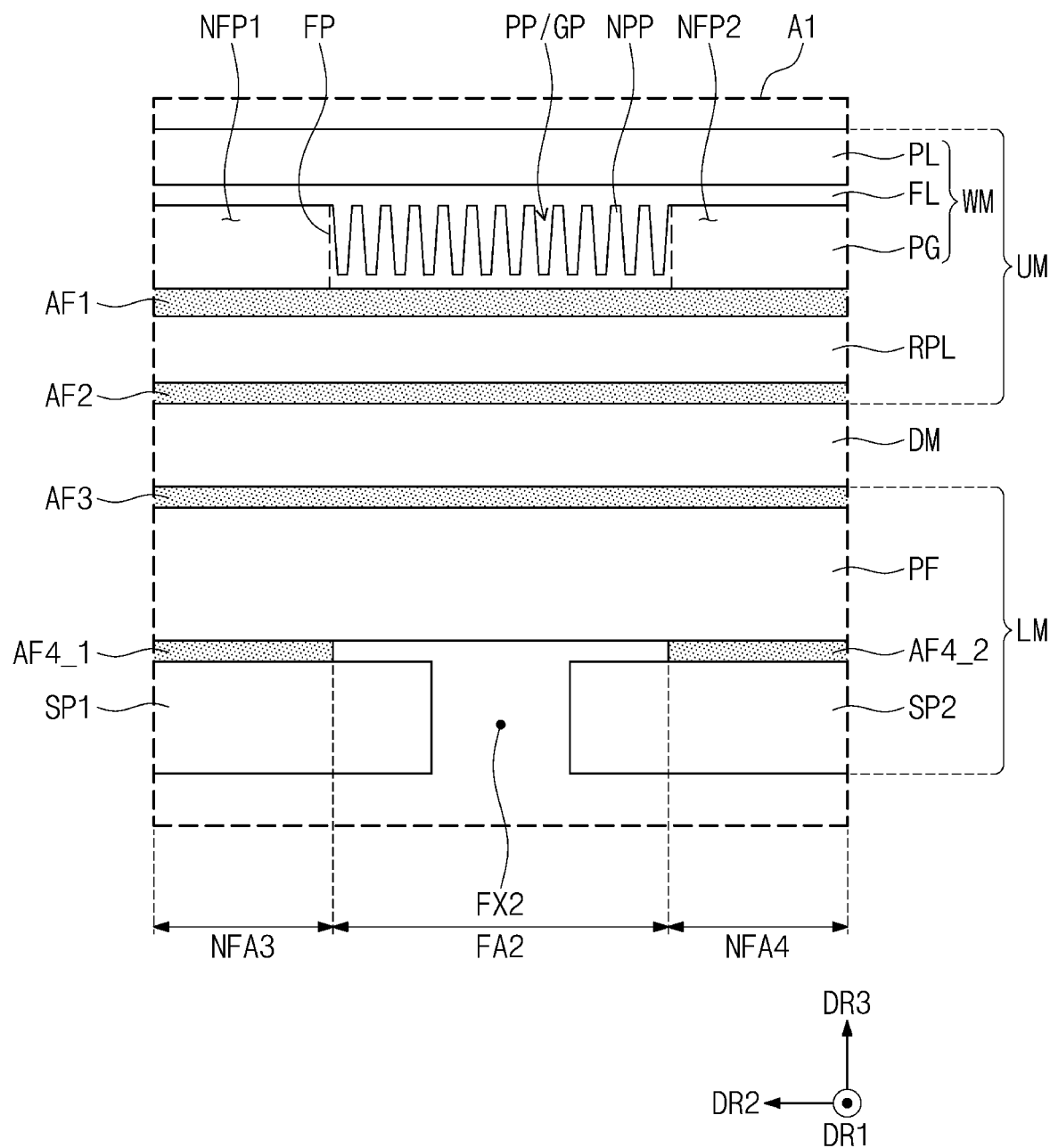
FIGS. 5B and 5C are enlarged cross-sectional views of portion A1 illustrated in FIG. 5A.
Figure 5C:
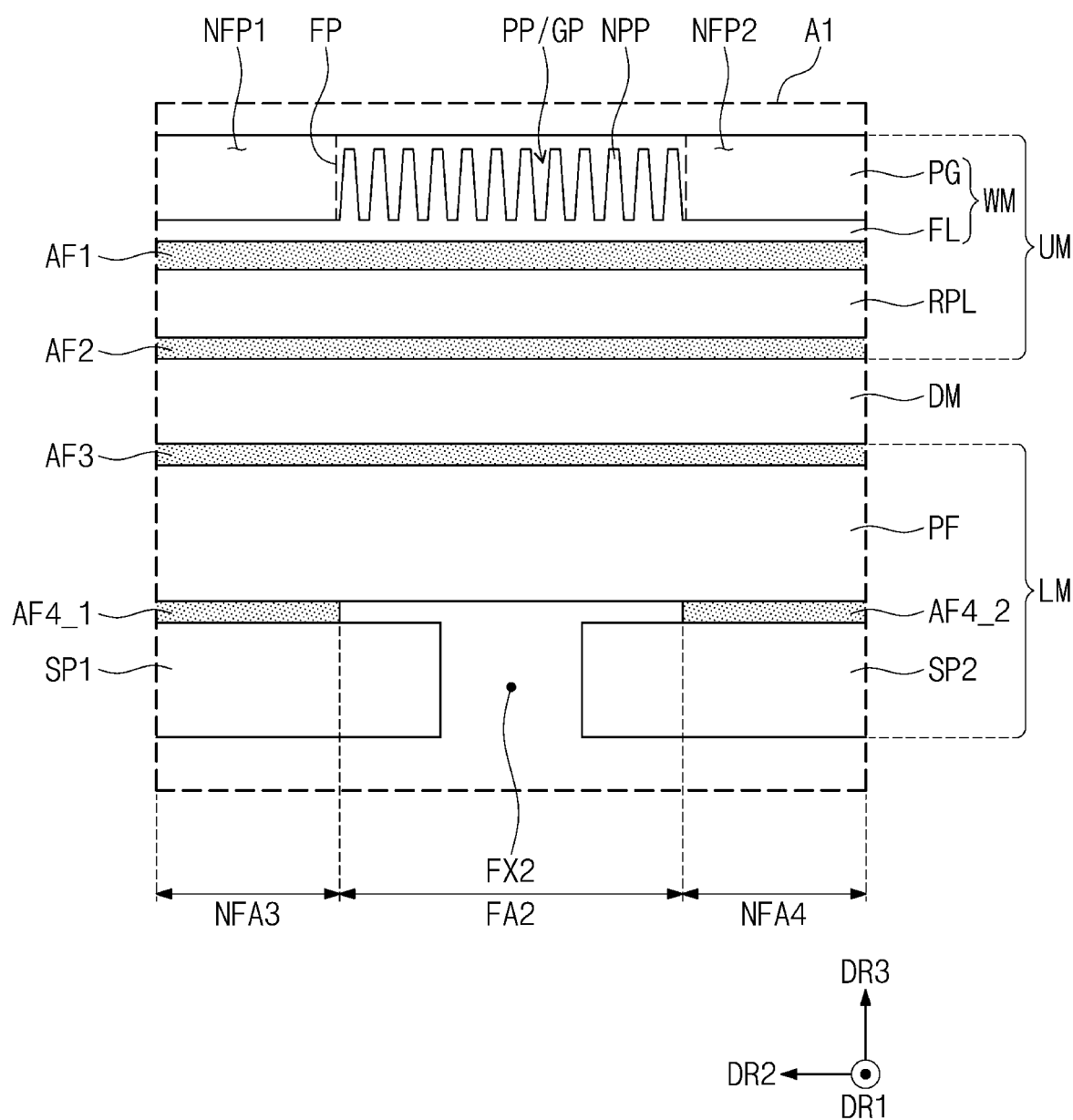

FIG. 4 is an exploded perspective view of the display device according to the embodiment of the present disclosure. FIG. 5A is a cross-sectional view of the display device taken along line I-I' illustrated in FIG. 4. FIGS. 5B and 5C are enlarged cross-sectional views of portion A1 illustrated in FIG. 5A.

Referring to FIGS. 4, 5A, and 5B, the display device DD, according to an embodiment of the present disclosure, may include a display module DM displaying an image, an upper module UM disposed over the display module DM, and a lower module LM disposed under the display module DM. The display module DM may constitute part of the display device DD. For example, an image may be generated by the display module DM.

The display module DM may include a display panel DP and an input sensing unit ISP. The display panel DP, according to an embodiment of the present disclosure, may be an emissive display panel, but the present invention is not necessarily limited thereto. For example, the display panel DP may be an organic light emitting display panel, an inorganic light emitting display panel, or a quantum dot light emitting display panel. An emissive layer of the organic light emitting display panel may include an organic light emitting material, and an emissive layer of the inorganic light emitting display panel may include an inorganic light emitting material. An emissive layer of the quantum dot light emitting display panel may include quantum dots, quantum rods, and the like. Hereinafter, the display panel DP will be described as an organic light emitting display panel.

The display panel DP may be a flexible display panel. Accordingly, the display panel DP may be rolled, or may be folded or unfolded about the folding axis FX2, without damaging the display panel DP.

The input sensing unit ISP may be directly disposed on the display panel DP. According to an embodiment of the present disclosure, the input sensing unit ISP may be formed on the display panel DP by a continuous process. For example, when the input sensing unit ISP is directly disposed on the display panel DP, an adhesive film is not disposed between the input sensing unit ISP and the display panel DP. However, the present disclosure is not necessarily limited thereto. An adhesive film may be disposed between the input sensing unit ISP and the display panel DP. In this case, the input sensing unit ISP might not be manufactured together with the display panel DP by a continuous process and may be manufactured separately from the display panel DP and then fixed to an upper surface of the display panel DP by the adhesive film.

The display panel DP generates an image, and the input sensing unit IDP obtains coordinate information on an input (e.g., a touch event) of a user.

The upper module UM may include a glass window WM disposed over the display module DM. The glass window WM may include an optically clear insulating material. Accordingly, the images generated by the display module DM may pass through the glass window WM and may be easily recognized by the user. The glass window WM may include a patterned glass PG and a filling layer FL.

The patterned glass PG may include a glass material. The patterned glass PG may include a folding portion FP and non-folding portions NFP1 and NFP2. The folding portion FP may be a portion corresponding to the folding area FA2, and the non-folding portions NFP1 and NFP2 may be portions that correspond to the first non-folding area NFA3 and the second non-folding area NFA4. The non-folding portions NFP1 and NFP2 may include the first non-folding portion NFP1 corresponding to the first non-folding area NFA3 and the second non-folding portion NFP2 corresponding to the second non-folding area NFA4. The folding portion FP may be disposed between the first non-folding portion NFP1 and the second non-folding portion NFP2.

The folding portion FP may include a plurality of pattern portions PP and non-pattern portions NPP adjacent to the plurality of pattern portions PP. In an embodiment of the present disclosure, when the folding axis FX2 extends in the first direction DR1, the pattern portions PP may be spaced apart from each other in the second direction DR2 perpendicular to the first direction DR1. One non-pattern portion NPP may be provided between two pattern portions PP adjacent to each other among the plurality of pattern portions PP. Each of the pattern portions PP may include at least one groove pattern GP (refer to FIG. 7) that is recessed from one surface (e.g., an upper surface) of the patterned glass PG. The groove pattern GP will be described below in detail with reference to FIGS. 6 to 11B.

The filling layer FL may include a synthetic resin material. The filling layer FL may include a material having a same refractive index as the patterned glass PG. In an embodiment of the present disclosure, the filling layer FL may include a urethane-based resin, an epoxy-based resin, a polyester-based resin, a polyether-based resin, an acrylate-based resin, an acrylonitrile-butadiene-styrene (ABS) resin, and/or rubber. For example, the filling layer FL may include at least one of phenylene, polyethlyeneterephthalate (PET), polyimide (PI), polyamide (PAI), polyethylene naphthalate (PEN), or polycarbonate (PC).

The filling layer FL may be disposed on the upper surface of the patterned glass PG. The groove pattern GP provided in the folding portion FP may be filled with the filling layer FL. Accordingly, the glass window WM may have a flat surface due to the filling layer FL. Furthermore, the filling layer FL may be disposed on the non-pattern portions NPP, the first non-folding portion NFP1, and the second non-folding portion NFP2 of the patterned glass PG while filling the groove pattern GP. The filling layer FL may be selectively provided in only the folding portion FP to fill the groove pattern GP.

The glass window WM may further include a protective layer PL. The protective layer PL may be provided on the filling layer FL. The protective layer PL may perform a function of protecting the patterned glass PG from an external impact. The protective layer PL may include a synthetic resin material. In an embodiment of the present disclosure, the protective layer PL may include a urethane-based resin, an epoxy-based resin, a polyester-based resin, a polyether-based resin, an acrylate-based resin, an acrylonitrile-butadiene-styrene (ABS) resin, and/or rubber. For example, the protective layer PL may include at least one of phenylene, polyethlyeneterephthalate (PET), polyimide (PI), polyamide (PAI), polyethylene naphthalate (PEN), or polycarbonate (PC).

As illustrated in FIG. 5C, when the groove pattern GP is provided on a lower surface of the patterned glass PG, the protective layer PL may be omitted from the glass window WM. Furthermore, the filling layer FL may be provided on the lower surface of the patterned glass PG, and the groove pattern GP may be filled with the filling layer FL.

The glass window WM may be folded or unfolded about the folding axis FX2. For example, the glass window WM may be deformed together when the display module DM is deformed. The glass window WM may alleviate an external impact while transmitting an image from the display module DM, thereby preventing damage to or malfunction of the display module DM due to the external impact. The external impact is an external force expressed as pressure, stress, or the like and refers to a force that causes a defect in the display module DM.

The upper module UM may further include at least one functional layer disposed between the display module DM and the glass window WM. In an embodiment of the present disclosure, the functional layer may be anti-reflection layer RPL that prevents reflection of external light. The anti-reflection layer RPL may prevent elements constituting the display module DM from being visible from the outside by external light incident through the front surface of the display device DD. The anti-reflection layer RPL may include a phase retarder and a polarizer. The phase retarder may be of a film type or a liquid-crystal coating type and may include a $\lambda/2$ phase retarder (e.g., a half-wave plate) and/or a $\lambda/4$ phase retarder (e.g., a quarter-wave plate). The polarizer may also be of a film type or a liquid-crystal coating type. The film type may include a stretched synthetic resin film, and the liquid-crystal coating type may include liquid crystals arranged in a predetermined arrangement.

The phase retarder and the polarizer may be implemented with one polarizer film. The functional layer may further include a protective film disposed on the top or bottom of the anti-reflection layer RPL.

The upper module UM may further include a first adhesive film AF1 provided between the anti-reflection layer RPL and the glass window WM and a second adhesive film AF2 provided between the anti-reflection layer RPL and the display module DM. The first adhesive film AF1 and the second adhesive film AF2 may include an optically clear adhesive material. In an embodiment of the present disclosure, each of the first adhesive film AF1 and the second adhesive film AF2 may include a pressure sensitive adhesive (PSA), an optically clear adhesive (OCA), or an optically clear resin (OCR).

The display module DM may display an image depending on an electrical signal and may transmit/receive information about an external input. The display module DM may be defined as an active area AA and a peripheral area NAA. The active area AA may be defined as an area that outputs an image provided by the display module DM.

The peripheral area NAA is adjacent to the active area AA. For example, the peripheral area NAA may at least partially surround the active area AA. However, this is illustrative, and the peripheral area NAA may be defined in various shapes and the present invention is not necessarily limited to any one embodiment. According to an embodiment, the active area AA of the display module DM may correspond to at least part of the display area DA.

The lower module LM includes a support plate SP that is disposed on a rear surface of the display module DM and that supports the display module DM. The support plate SP may include as many support plates as the non-folding areas NFA3 and NFA4. In an embodiment of the present disclosure, the support plate SP may include a first support plate SP1 and a second support plate SP2 spaced apart from the first support plate SP1.

The first support plate SP1 and the second support plate SP2 may be disposed to correspond to the first non-folding area NFA3 and the second non-folding area NFA4, respectively. The first support plate SP1 may be disposed to correspond to the first non-folding area NFA3 of the display module DM, and the second support plate SP2 may be disposed to correspond to the second non-folding area NFA4 of the display module DM. The first support plate SP1 and the second support plate SP2 may include a metallic material or a plastic material.

When the display module DM has the first state of being flat, the first support plate SP1 and the second support plate SP2 may be spaced apart from each other in the second direction DR2. When the display module DM has the second state of being folded about the folding axis FX2, the first support plate SP1 and the second support plate SP2 may be spaced apart from each other in the third direction DR3.

The first support plate SP1 and the second support plate SP2 may be spaced apart from each other to correspond to the folding area FA2. The first support plate SP1 and the second support plate SP2 may partially overlap the folding area FA2. For example, the separation distance between the first support plate SP1 and the second support plate SP2 in the second direction DR2 may be smaller than the width of the folding area FA2.

The support plate SP may further include a connecting module for connecting the first support plate SP1 and the second support plate SP2. The connecting module may include a hinge module or a multi-joint module.

Although the support plate SP is illustrated as including the two support plates SP1 and SP2, the present disclosure is not necessarily limited thereto. For example, when the display device DD includes a plurality of folding axes FX2, the support plate SP may include a plurality of support plates separated from one another with respect to the plurality of folding axes FX2. Furthermore, the support plate SP may be provided in an integrated shape (e.g., as one integrated structure) without being divided into the first support plate SP1 and the second support plate SP2. In this case, the support plate SP may include a bending portion corresponding to the folding area FA2. The bending portion may have an opening formed through the support plate SP or a groove recessed from one surface of the support plate SP.

The lower module LM further includes a protective film PF disposed between the display module DM and the support plate SP. The protective film PF may be a layer that is disposed under the display module DM and that protects the rear surface of the display module DM. The protective film PF may include a synthetic resin film. For example, the protective film PF may be a polyimide film or a polyethlyeneterephthalate film. However, this is illustrative, and the present invention is not necessarily limited to any one type of protective film PF.

The lower module LM may further include a third adhesive film AF3 disposed between the protective film PF and the display module DM and a fourth adhesive film disposed between the protective film PF and the support plate SP. The protective film PF may be attached to the rear surface of the display module DM by the third adhesive film AF3. In an embodiment of the present disclosure, the fourth adhesive film may include a first sub-adhesive film AF4_1 and a second sub-adhesive film AF4_2. The first sub-adhesive film AF4_1 is disposed between the first support plate SP1 and the protective film PF, and the second sub-adhesive film AF4_2 is disposed between the second support plate SP2 and the protective film PF. The first sub-adhesive film AF4_1 and the second sub-adhesive film AF4_2 may be spaced apart from each other with the folding area FA2 interposed therebetween.

Each of the third adhesive film AF3, the first sub-adhesive film AF4_1 and the second sub-adhesive film AF4_2 may include an optically clear adhesive material. In an embodiment of the present disclosure, each of the third adhesive film AF3, the first sub-adhesive film AF4_1 and the second sub-adhesive film AF4_2 may include a pressure sensitive adhesive (PSA), an optically clear adhesive (OCA), or an optically clear resin (OCR).

Figure 7:
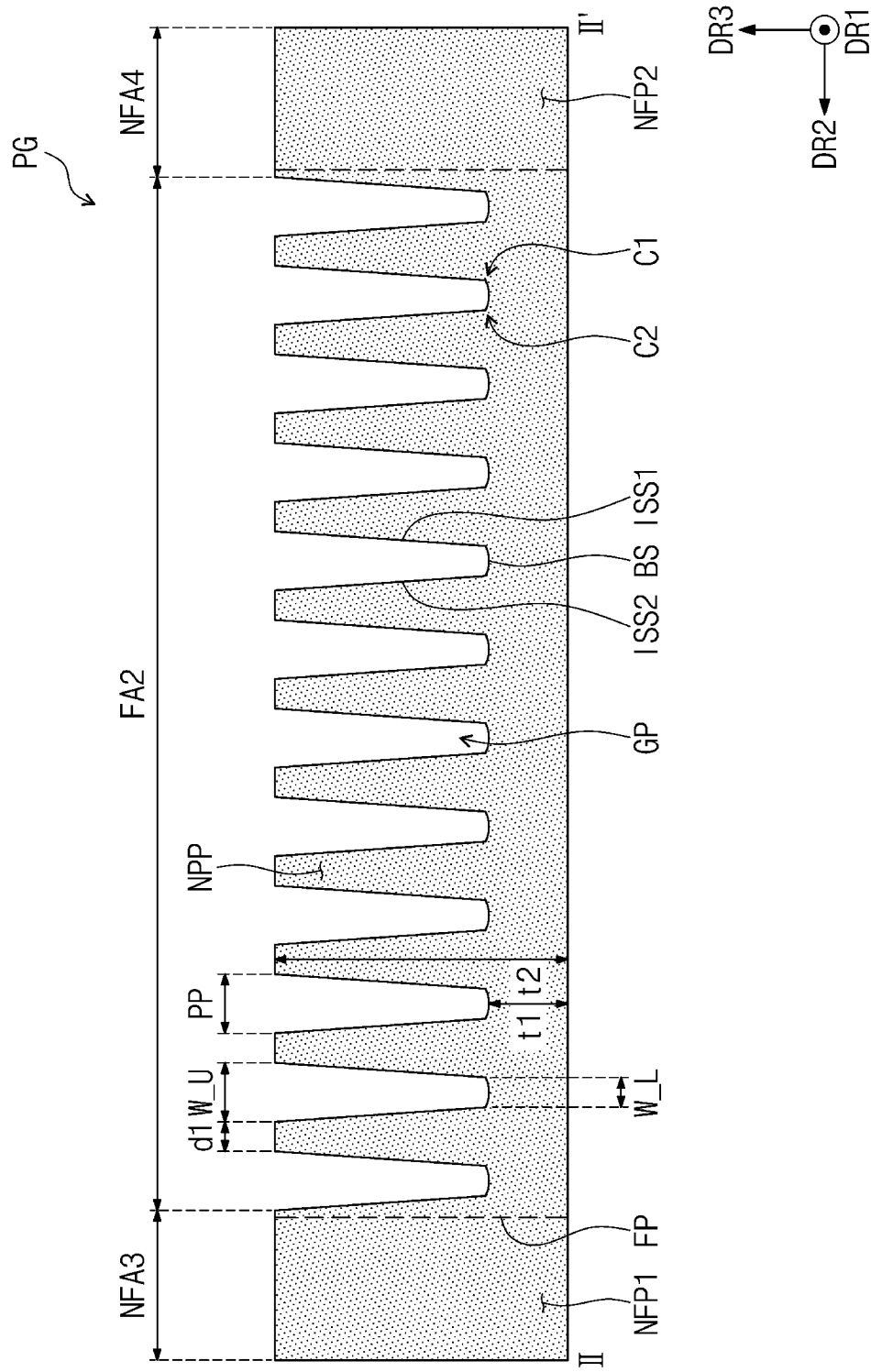
FIG. 7 is a cross-sectional view of the patterned glass taken along line II-II' illustrated in FIG. 6.

FIG. 6 is a plan view of the patterned glass illustrated in FIG. 5B, and FIG. 7 is an enlarged view of portion A2 illustrated in FIG. 5B.

Referring to FIGS. 6 and 7, the patterned glass PG may include the folding portion FP and the non-folding portions NFP1 and NFP2. The folding portion FP corresponds to the folding area FA2. The non-folding portions NFP1 and NFP2 may include the first non-folding portion NFP1 corresponding to the first non-folding area NFA3 and the second non-folding portion NFP2 corresponding to the second non-folding area NFA4. The folding portion FP may be disposed between the first non-folding portion NFP1 and the second non-folding portion NFP2.

The folding portion FP may include the plurality of pattern portions PP and the non-pattern portions NPP adjacent to the plurality of pattern portions PP. In an embodiment of the present disclosure, when the folding axis FX2 extends in the first direction DR1, the plurality of pattern portions PP may be spaced apart from each other in the second direction DR2 perpendicular to the first direction DR1. One non-pattern portion NPP may be provided between two pattern portions PP adjacent to each other among the plurality of pattern portions PP.

Each of the pattern portions PP may include at least one groove pattern GP. In an embodiment of the present disclosure, the groove pattern GP may have a groove shape recessed from one surface of the patterned glass PG. The groove pattern GP may have a stripe shape extending in a direction parallel to the folding axis FX2 (for example, the first direction DR1). Although FIG. 6 illustrates a structure in which the pattern portion PP includes one groove pattern GP, the present disclosure is not necessarily limited thereto. The pattern portion PP may include a plurality of sub-groove patterns spaced apart from each other in the first direction DR1.

Referring to FIG. 7, the groove pattern GP may have an inverted trapezoidal shape in the cross-section. For example, a lower end portion of the groove pattern GP may have a smaller width than an upper end portion of the groove pattern GP. The width of the lower end portion may be referred to as a first width W_L, and the width of the upper end portion may be referred to as a second width W_U. The first width W_L may be about 40 µm or more. The first width W-L is not necessarily limited thereto. The first width W_L may affect folding characteristics of the glass window WM. For example, as the first width W_L decreases, the folding characteristics of the glass window WM may be deteriorated.

The pattern portion PP may include inside surfaces and a bottom surface BS that define the groove pattern GP. An inside surface disposed on a first side with respect to the groove pattern GP may be referred to as a first inside surface ISS1, and an inside surface disposed on a second side with respect to the groove pattern GP may be referred to as a second inside surface ISS2. The first inside surface ISS1 and the second inside surface ISS2 may have an inclined structure tilted at a predetermined angle. The first inside surface ISS1 and the second inside surface ISS2 may be inclined at less than about 90 degrees with respect to the bottom surface BS.

The bottom surface BS is connected with the first inside surface ISS1 and the second inside surface ISS2. Here, a portion where the first inside surface ISS1 and the bottom surface BS are connected is defined as a first corner C1, and a portion where the second inside surface ISS2 and the bottom surface BS are connected is defined as a second corner C2. The bottom surface BS may have a flat shape or a round shape. Furthermore, the first corner C1 and the second corner C2 may have a round shape. In the case where the first corner C1 and the second corner C2 have a round shape, the first corner C1 and the second corner C2 may be prevented from cracking due to stress applied to the folding portion FP when the glass window WM is folded.

A non-pattern portion NPP is provided between two adjacent pattern portions PP. The two pattern portions PP may be spaced apart from each other at a first interval d1. In an embodiment of the present disclosure, the pattern portions PP may be spaced apart from each other at predetermined intervals in the second direction DR2. The first interval d1 may be referred to as the width of the non-pattern portion NPP. The first interval d1 may be smaller than the second width W_U. When the first interval d1 is greater than the second width W_U, folding characteristics of the folding portion FP may be deteriorated.

The first interval d1 may be varied depending on the position of the folding portion FP. For example, the first interval d1 may increase farther away from the folding axis FX2. In this case, the width of a non-pattern portion NPP located adjacent to the folding axis FX2 may be smaller than the second width W-U, but the width of a non-pattern portion NPP located far away from the folding axis FX2 may be greater than or equal to the second width W_U.

Each of the pattern portions PP has a first thickness t1, and the non-pattern portion NPP has a second thickness t2. The second thickness t2 is greater than the first thickness t1. In an embodiment of the present disclosure, the first thickness t1 may be smaller than or equal to one-half of the second thickness t2. For example, the ratio of the first thickness t1 to the second thickness t2 may be set to 1:2, 1:3, 1:4, 1:5, or the like. When the first thickness t1 is smaller than or equal to about 0.2 times the second thickness t2, the glass window WM may be more readily folded without damage. For example, folding stress of the folding portion FP may decrease as the first thickness t1 decreases. In an embodiment of the present disclosure, the first thickness t1 may range from about 10 µm to about 50 µm.

The first non-folding portion NFP1 and the second non-folding portion NFP2 may have the second thickness t2 equal to that of the non-pattern portion NPP. The impact resistance of the glass window WM may be determined depending on the second thickness t2. For example, with an increase in the second thickness t2, deformation of the glass window WM caused by an external impact may be decreased, and a cracking phenomenon caused by an external impact may be minimized. In an embodiment of the present disclosure, the second thickness t2 may range from about 150 µm to about 300 µm.

When the first thickness t1 is set to be smaller than or equal to about 0.5 times the second thickness t2, the folding stress of the glass window WM may be decreased, and the impact resistance of the glass window WM may be increased.

Figure 8A:
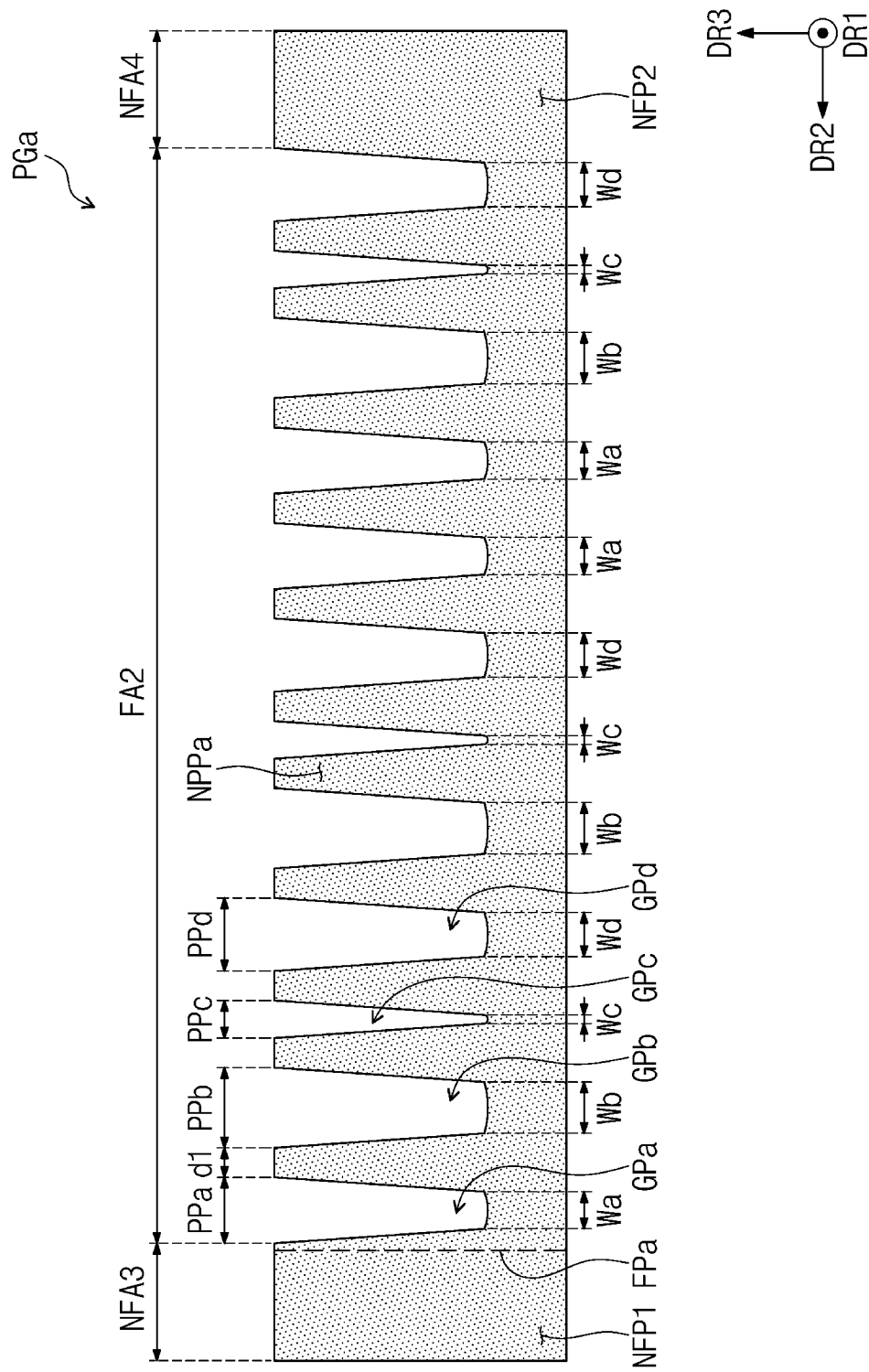
FIGS. 8A to 8C are cross-sectional views illustrating a patterned glass according to embodiments of the present disclosure.
Figure 8B:
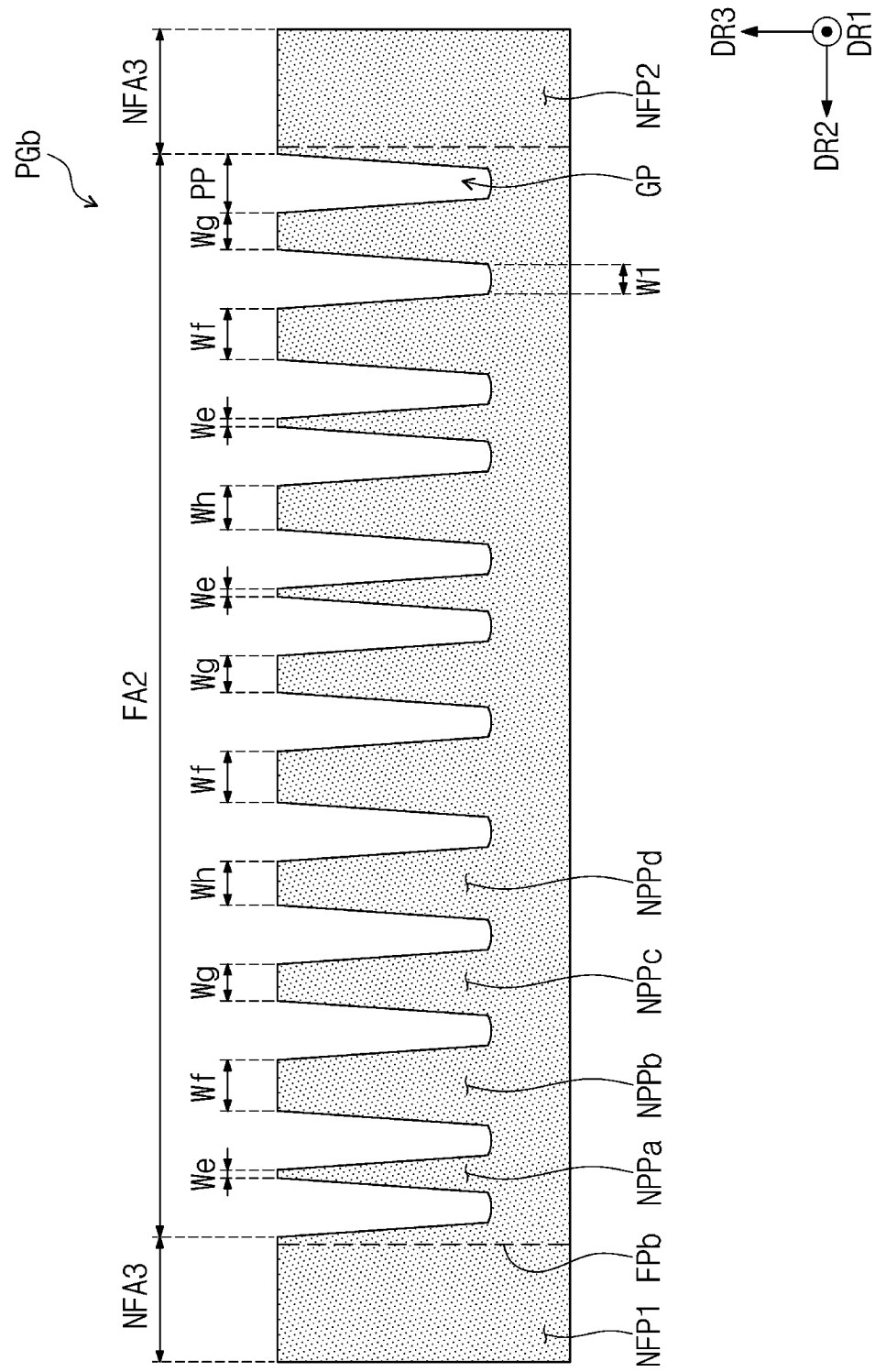
Figure 8C:
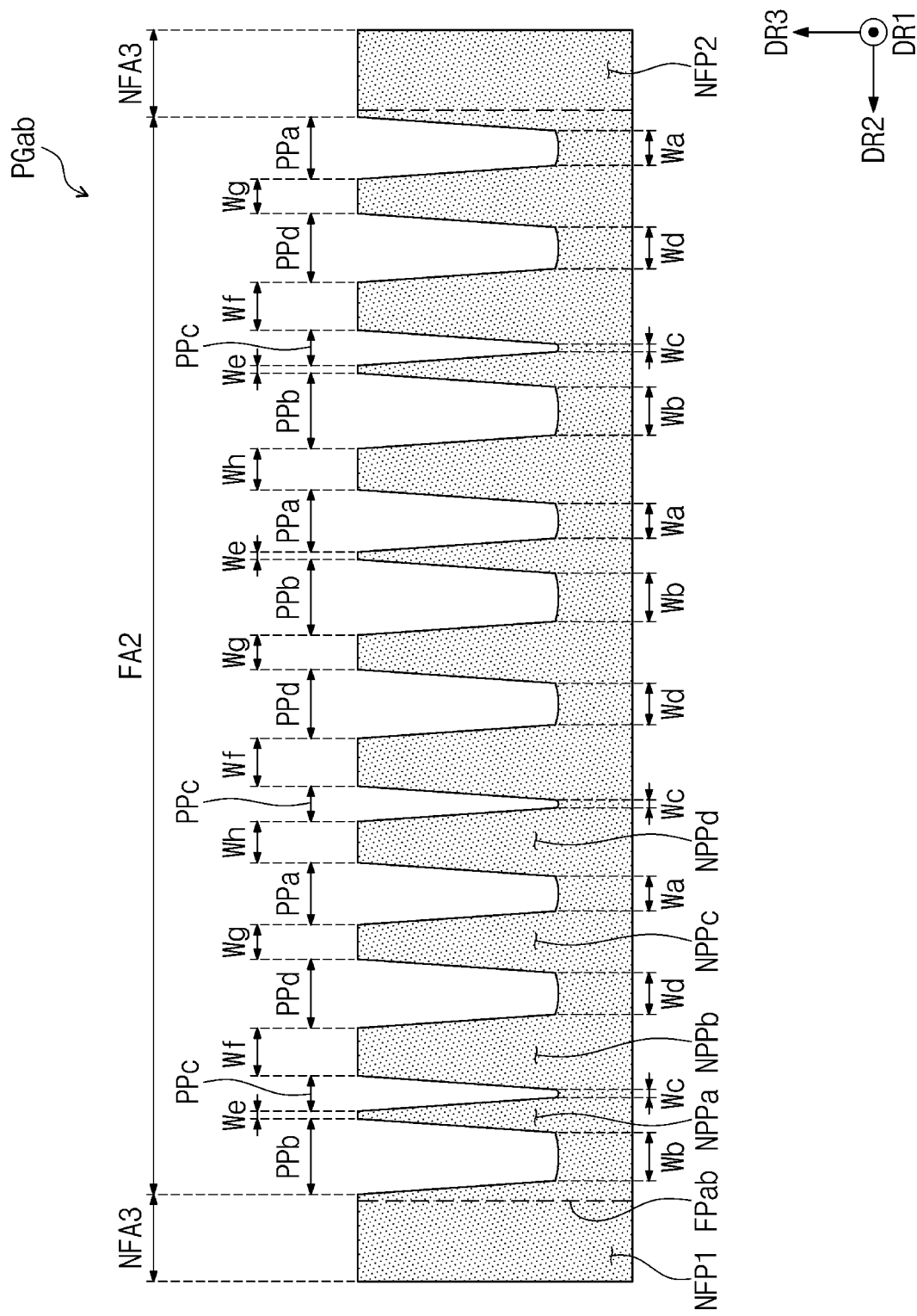

FIGS. 8A to 8C are cross-sectional views illustrating a patterned glass according to embodiments of the present disclosure. To the extent that various elements are not described in detail with respect to FIGS. 8A to 8C, it may be assumed that these elements are at least similar to corresponding elements described in detail elsewhere within the instant application. Corresponding elements may have similar or identical reference numerals or may otherwise be recognizable as corresponding based on context.

Referring to FIG. 8A, a folding portion FPa of patterned glass PGa includes a plurality of pattern portions PPa to PPd and a plurality of non-pattern portions NPPa. The plurality of pattern portions PPa to PPd and the plurality of non-pattern portions NPPa are alternately disposed in the second direction DR2.

The pattern portions PPa to PPd include groove patterns GPa to GPd, respectively. The groove patterns GPa to GPd of the pattern portions PPa to PPd may have different widths. In an embodiment of the present disclosure, the plurality of pattern portions PPa to PPd may include a plurality of first pattern portions PPa, a plurality of second pattern portions PPb, a plurality of third pattern portions PPc, and a plurality of fourth pattern portions PPd. Each of the first pattern portions PPa includes the first groove pattern GPa, and the first groove pattern GPa has a first width Wa. Each of the second pattern portions PPb includes the second groove pattern GPb, and the second groove pattern GPb has a second width Wb. Each of the third pattern portions PPc includes the third groove pattern GPc, and the third groove pattern GPc has a third width Wc. Each of the fourth pattern portions PPd includes the fourth groove pattern GPd, and the fourth groove pattern GPd has a fourth width Wd. The first to fourth widths Wa, Wb, Wc, and Wd may differ from one another.

In an embodiment of the present disclosure, the first to fourth groove patterns GPa, GPb, GPc, and GPd may be randomly arranged in the folding portion FPa. When the groove patterns GPa, GPb, GPc, and GPd having different widths are randomly arranged, a moire phenomenon in the folding area FA2 may be prevented, and thus visibility may be increased.

As used herein, the phrase "randomly arranged" may mean that elements having different characteristics are mixed up with no perceivable order, regardless of the manner of selection used to produce the arrangement. Thus, there need not be any random allocation used and the arrangement may be selected so as to appear to not have any recognizable pattern.

Although FIG. 8A illustrates a structure in which four groove patterns GPa, GPb, GPc, and GPd having different widths are randomly arranged, the number of groove patterns is not necessarily limited thereto. For example, six groove patterns having different widths may be randomly arranged. As the number of groove patterns having different widths increases, the moire phenomenon may be efficiently reduced.

In FIG. 8A, the plurality of pattern portions PPa to PPd may be constantly spaced apart from each other at first intervals d1. For example, the plurality of non-pattern portions NPPa may have the same width. However, the present disclosure is not necessarily limited thereto.

Referring to FIG. 8B, a folding portion FPb of a patterned glass PGb includes a plurality of pattern portions PP and a plurality of non-pattern portions NPPa to NPPd. The plurality of pattern portions PP and the plurality of non-pattern portions NPPa to NPPd are alternately disposed in the second direction DR2. Each of the plurality of pattern portions PP includes a groove pattern GP. The groove patterns GP of the pattern portions PP may have the same width. The groove patterns GP may have a first width W1.

In FIG. 8B, the plurality of pattern portions PP may be spaced apart from each other at irregular intervals. For example, the plurality of non-pattern portions NPPa to NPPd may have different widths. In an embodiment of the present disclosure, the plurality of non-pattern portions NPPa to NPPd may include a plurality of first non-pattern portions NPPa, a plurality of second non-pattern portions NPPb, a plurality of third non-pattern portions NPPc, and a plurality of fourth non-pattern portions NPPd. The first non-pattern portions NPPa have a fifth width We, and the second non-pattern portions NPPb have a sixth width Wf. The third non-pattern portions NPPc have a seventh width Wg, and the fourth non-pattern portions NPPd have an eighth width Wh. The fifth to eighth widths We, Wf, Wg, and Wh may differ from one another.

In an embodiment of the present disclosure, the first to fourth non-pattern portions NPPa, NPPb, NPPc, and NPPd may be randomly arranged in the folding portion FPb. When the first to fourth non-pattern portions NPPa, NPPb, NPPc, and NPPd having different widths are randomly arranged, a moire phenomenon in the folding area FA2 may be prevented, and thus visibility may be increased.

Although FIG. 8B illustrates a structure in which four non-pattern portions NPPa, NPPb, NPPc, and NPPd having different widths are randomly arranged, the number of non-pattern portions is not necessarily limited thereto. For example, six non-pattern portions having different widths may be randomly arranged. As the number of non-pattern portions having different widths increases, the moire phenomenon may be efficiently reduced.

Referring to FIG. 8C, a folding portion FPab of patterned glass PGab includes a plurality of pattern portions PPa to PPd and a plurality of non-pattern portions NPPa to NPPd. The plurality of pattern portions PPa to PPd and the plurality of non-pattern portions NPPa to NPPd are alternately disposed in the second direction DR2.

The pattern portions PPa to PPd include groove patterns GPa to GPd, respectively. The groove patterns GPa to GPd of the pattern portions PPa to PPd may have different widths. In an embodiment of the present disclosure, the plurality of pattern portions PPa to PPd may include a plurality of first pattern portions PPa, a plurality of second pattern portions PPb, a plurality of third pattern portions PPc, and a plurality of fourth pattern portions PPd. Each of the first pattern portions PPa includes the first groove pattern GPa, and the first groove pattern GPa has a first width Wa. Each of the second pattern portions PPb includes the second groove pattern GPb, and the second groove pattern GPb has a second width Wb. Each of the third pattern portions PPc includes the third groove pattern GPc, and the third groove pattern GPc has a third width Wc. Each of the fourth pattern portions PPd includes the fourth groove pattern GPd, and the fourth groove pattern GPd has a fourth width Wd. The first to fourth widths Wa, Wb, Wc, and Wd may differ from one another.

In an embodiment of the present disclosure, the first to fourth groove patterns GPa, GPb, GPc, and GPd may be randomly arranged in the folding portion FPab.

The plurality of pattern portions PPa to PPd may be spaced apart from each other at irregular intervals. For example, the plurality of non-pattern portions NPPa to NPPd may have different widths. In an embodiment of the present disclosure, the plurality of non-pattern portions NPPa to NPPd may include a plurality of first non-pattern portions NPPa, a plurality of second non-pattern portions NPPb, a plurality of third non-pattern portions NPPc, and a plurality of fourth non-pattern portions NPPd. The first non-pattern portions NPPa have a fifth width We, and the second non-pattern portions NPPb have a sixth width Wf. The third non-pattern portions NPPc have a seventh width Wg, and the fourth non-pattern portions NPPd have an eighth width Wh. The fifth to eighth widths We, Wf, Wg, and Wh may differ from one another.

When the groove patterns GPa, GPb, GPc, and GPd having different widths and the first to fourth non-pattern portions NPPa, NPPb, NPPc, and NPPd having different widths are randomly arranged, a moire phenomenon in the folding area FA2 may be prevented, and thus visibility may be increased.

Figure 9A:
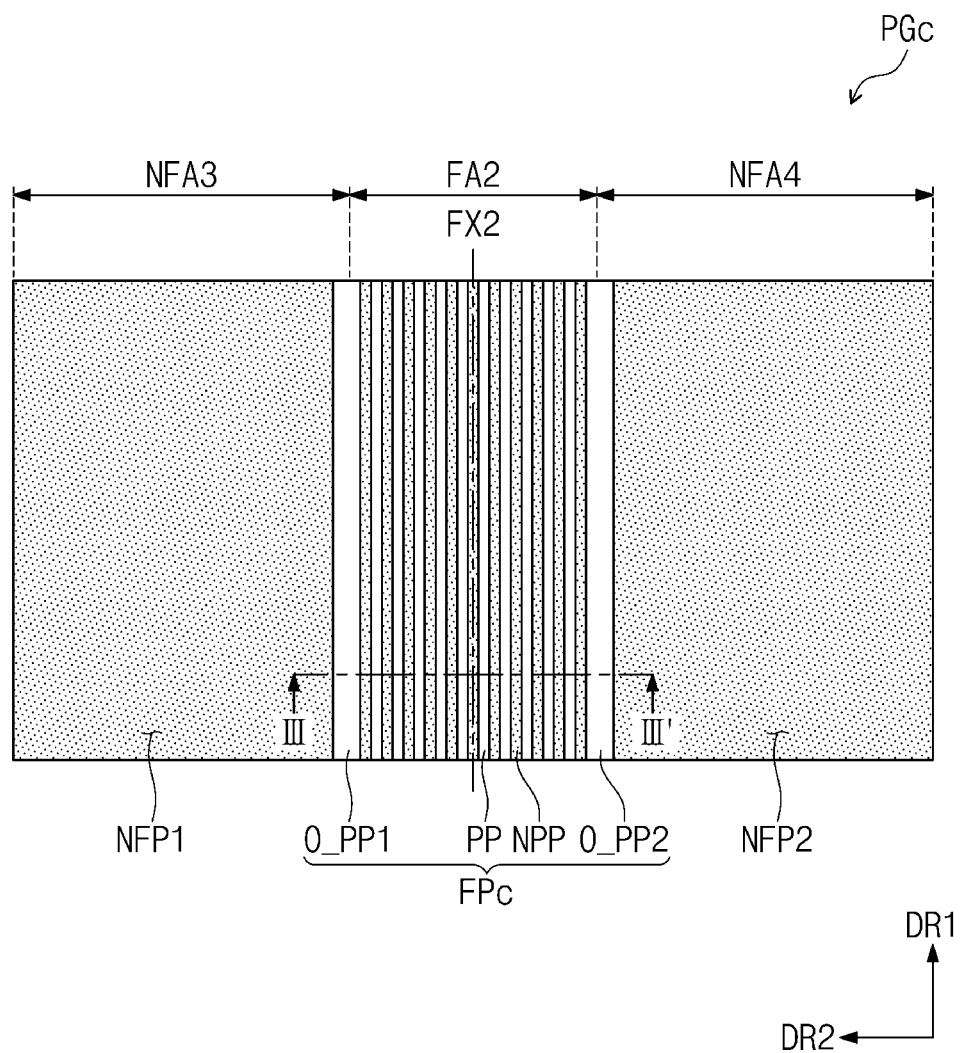
FIG. 9A is a plan view of a patterned glass according to an embodiment of the present disclosure.
Figure 9B:
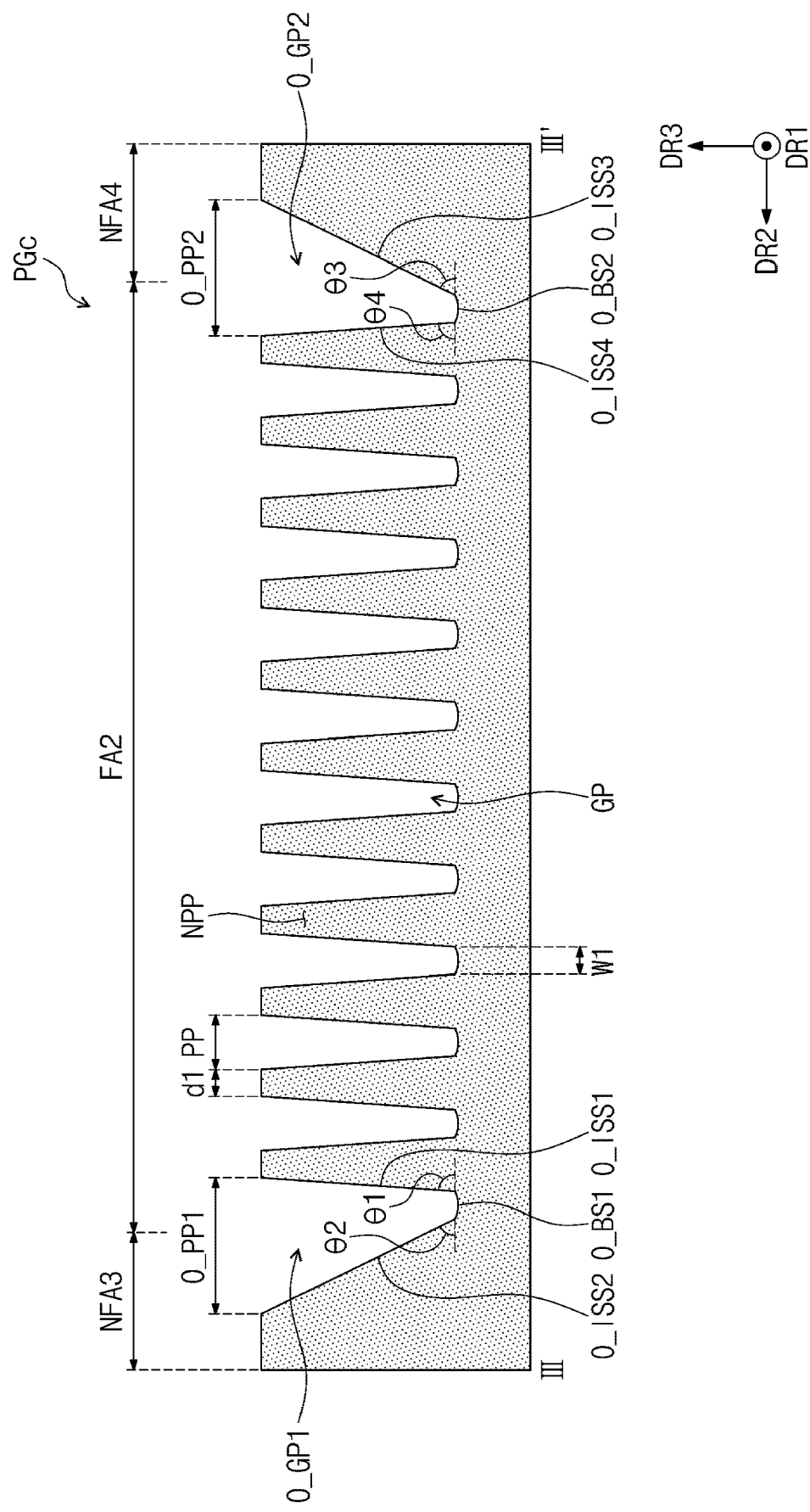
FIG. 9B is a cross-sectional view of the patterned glass taken along line III-III' illustrated in FIG. 9A.

FIG. 9A is a plan view of a patterned glass according to an embodiment of the present disclosure, and FIG. 9B is a cross-sectional view of the patterned glass taken along line III-III' illustrated in FIG. 9A. To the extent that various elements are not described in detail with respect to FIGS. 9A and 9B, it may be assumed that these elements are at least similar to corresponding elements described in detail elsewhere within the instant application. Corresponding elements may have similar or identical reference numerals or may otherwise be recognizable as corresponding based on context Referring to FIGS. 9A and 9B, a folding portion FPc of the patterned glass PGc according to the embodiment of the present disclosure includes a plurality of pattern portions PP and a plurality of non-pattern portions NPP. The folding portion FPc further includes a first outermost pattern portion O_PP1 and a second outermost pattern portion O_PP2. The first outermost pattern portion O_PP1 includes a first outermost groove pattern O_GP1, and the second outermost pattern portion O_PP2 includes a second outermost groove pattern O_GP2.

At least one of the first outermost groove pattern O_GP1 or the second outermost groove pattern O_GP2 may have a different shape from the plurality of pattern portions PP. The first outermost groove pattern O_GP1 and the second outermost groove pattern O_GP2 may have symmetrical shapes with respect to the folding axis FX2.

The first outermost pattern portion O_PP1 may include a first outermost bottom surface O_BS1, a first outermost inside surface O_ISS1, a second outermost inside surface O_ISS2 that define the first outermost groove pattern O_GP1. The second outermost pattern portion O_PP2 may include a second outermost bottom surface O_BS2, a third outermost inside surface O_ISS3, a fourth outermost inside surface O_ISS4 that define the second outermost groove pattern O_GP2. The first outermost inside surface O_ISS1 and the second outermost inside surface O_ISS2 have inclined structures with respect to the first outermost bottom surface O_BS1. The inclination angle (hereinafter, referred to as the first inclination angle $\theta 1$) of the first outermost inside surface O_ISS1 with respect to the first outermost bottom surface O_BS1 may differ from the inclination angle (hereinafter, referred to as the second inclination angle $\theta 2$) of the second outermost inside surface O_ISS2 with respect to the first outermost bottom surface O_BS1. The second inclination angle $\theta 2$ may be smaller than the first inclination angle $\theta 1$. The third outermost inside surface O_ISS3 and the fourth outermost inside surface O_ISS4 have inclined structures with respect to the second outermost bottom surface O_BS2. The inclination angle (hereinafter, referred to as the third inclination angle $\theta 3$) of the third outermost inside surface O_ISS3 with respect to the second outermost bottom surface O_BS2 may differ from the inclination angle (hereinafter, referred to as the fourth inclination angle $\theta 4$) of the fourth outermost inside surface O_ISS4 with respect to the second outermost bottom surface O_BS2. The third inclination angle $\theta 3$ may be smaller than the fourth inclination angle $\theta 4$. In an embodiment of the present disclosure, the second inclination angle $\theta 2$ and the third inclination angle $\theta 3$ may range from about 40 degrees to about 70 degrees, and the first inclination angle $\theta 1$ and the fourth inclination angle $\theta 4$ may range from about 70 degrees to about 90 degrees.

The second outermost inside surface O_ISS2 may at least partially overlap the first non-folding area NFA3, and the third outermost inside surface O_ISS3 may at least partially overlap the second non-folding area NFA4. The thickness of the patterned glass PGc in a first non-folding portion NFP1 adjacent to the folding portion FPc may be gradually increased by the second outermost inside surface O_ISS2. Furthermore, the thickness of the patterned glass PGc in a second non-folding portion NFP2 adjacent to the folding portion FPc may be gradually increased by the third outermost inside surface O_ISS3. Accordingly, stress applied to the patterned glass PGc on the border between the folding portion FPc and the first non-folding portion NFP1 and the border between the folding portion FPc and the second non-folding portion NFP2 may be reduced.

Figure 10A:
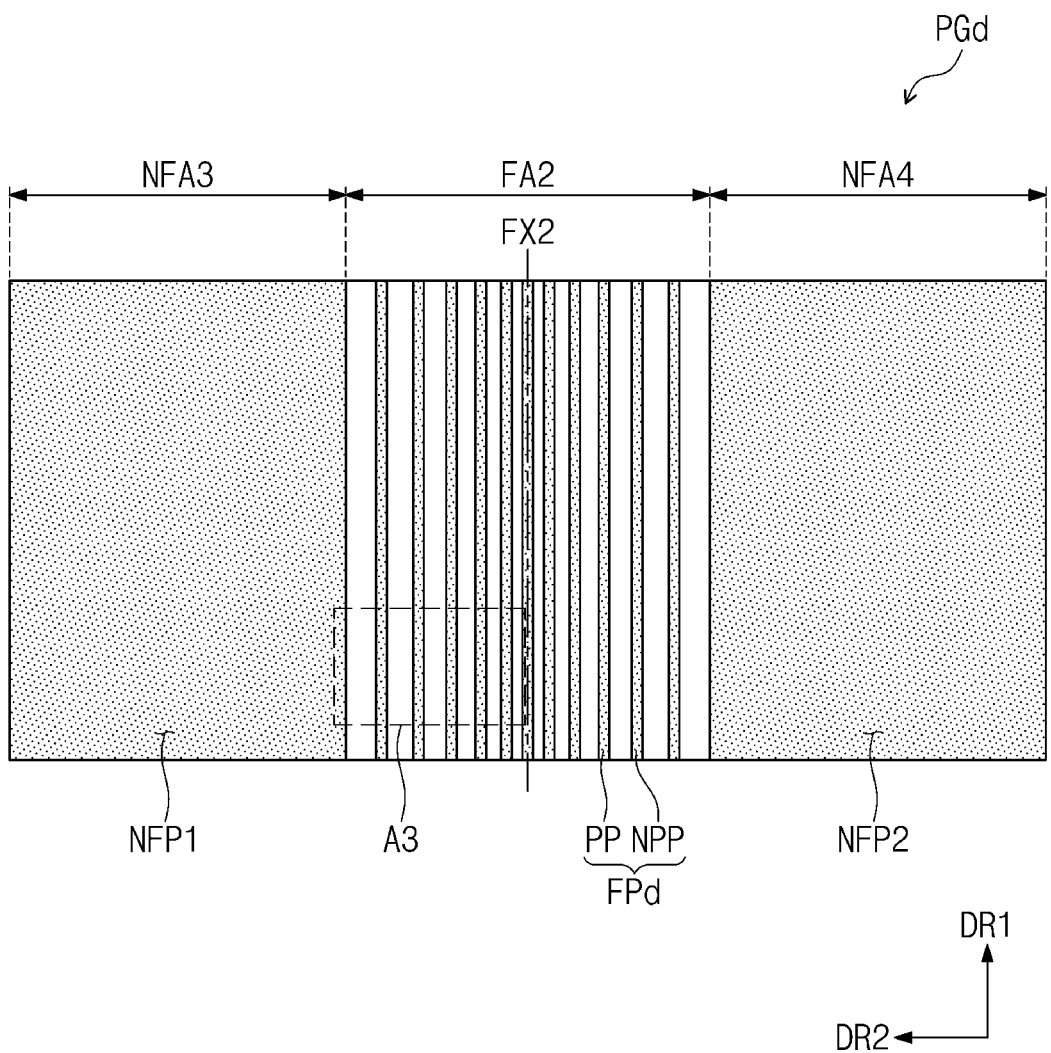
FIG. 10A is a plan view of a patterned glass according to an embodiment of the present disclosure.
Figure 10B:
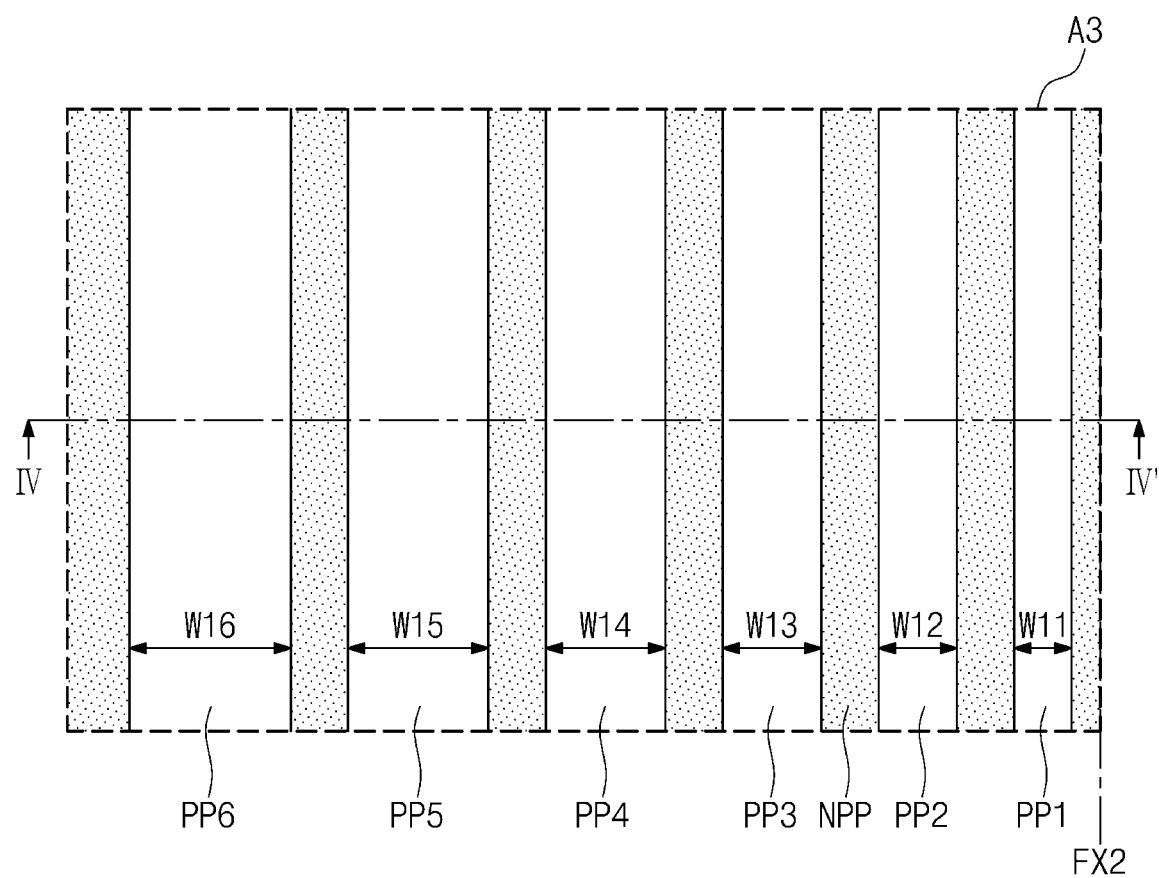
FIG. 10B is an enlarged view of portion A3 of FIG. 10A.
Figure 11A:
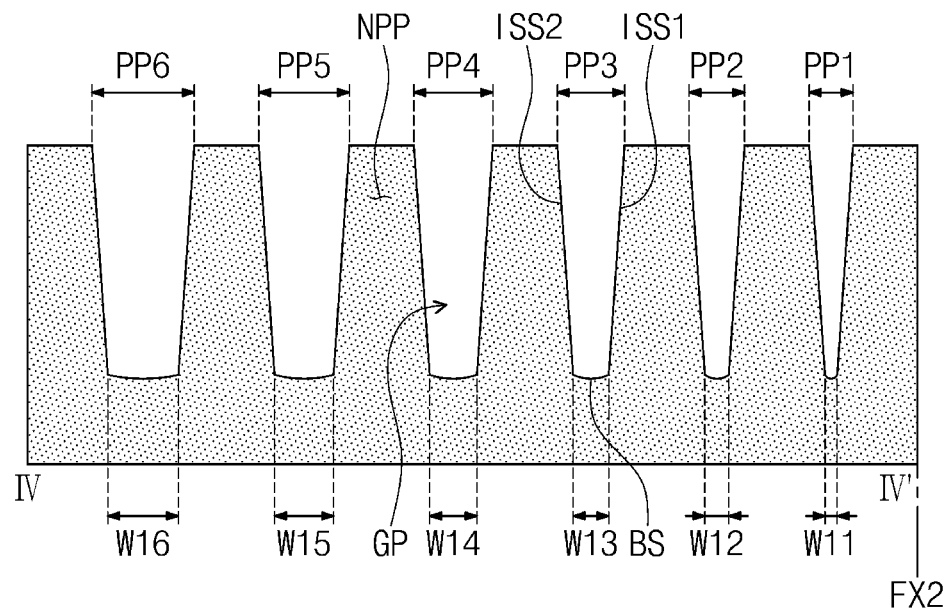
FIGS. 11A and 11B are cross-sectional views of the patterned glass taken along line IV-IV' illustrated in FIG. 10B.
Figure 11B:
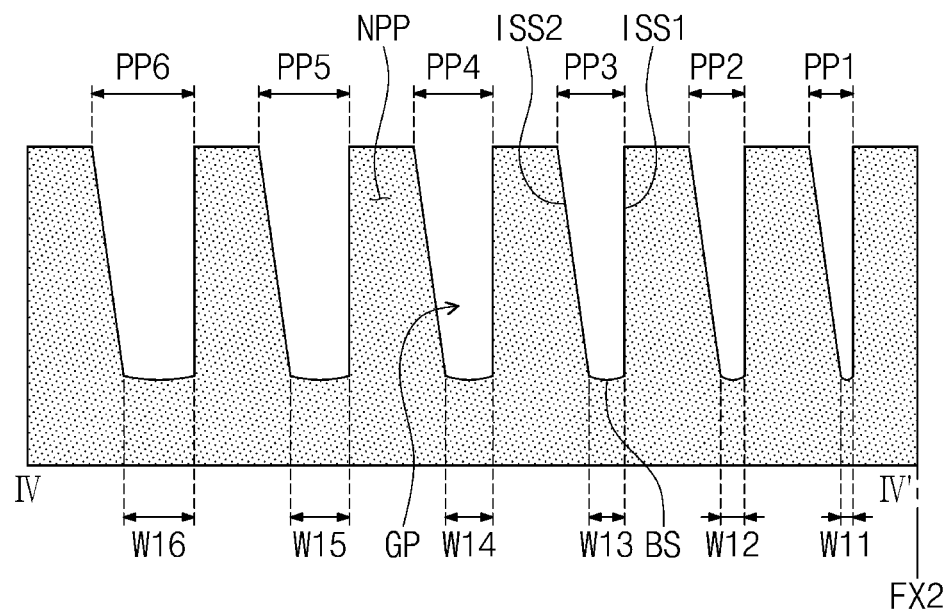

FIG. 10A is a plan view of a patterned glass according to an embodiment of the present disclosure, and FIG. 10B is an enlarged view of portion A3 of FIG. 10A. FIGS. 11A and 11B are cross-sectional views of the patterned glass taken along line IV-IV' illustrated in FIG. 10B.

Referring to FIGS. 10A and 10B, the patterned glass PGd may include a folding portion FPd, a first non-folding portion NFP1, and a second non-folding portion NFP2. The folding portion FPd may be disposed between the first non-folding portion NFP1 and the second non-folding portion NFP2. The folding portion FPd may include a plurality of pattern portions PP and a plurality of non-pattern portions NPP. In an embodiment of the present disclosure, when the folding axis FX2 extends in the first direction DR1, the plurality of pattern portions PP may be spaced apart from each other in the second direction DR2 perpendicular to the folding axis FX2. The plurality of pattern portions PP and the plurality of non-pattern portions NPP may be alternately disposed in the second direction DR2.

The pattern portions PP may have different widths depending on the distances from the folding axis FX2. For example, six pattern portions disposed on one side of the folding axis FX2 are referred to as first to sixth pattern portions PP1 to PP6. The first to sixth pattern portions PP1 to PP6 have different widths. The widths of the first to sixth pattern portions PP1 to PP6 may be referred to as first to sixth pattern widths W11 to W16, respectively. The first to sixth pattern widths W11 to W16 may gradually increase farther away from the folding axis FX2. The first pattern width W11 of the first pattern portion PP1 closest to the folding axis FX2 may be the smallest of the first to sixth pattern widths W11 to W16, and the sixth pattern width W16 of the sixth pattern portion PP6 farthest from the folding axis FX2 may be the largest of the first to sixth pattern widths W11 to W16.

Referring to FIGS. 11A and 11B, each of the first to sixth pattern portions PP1 to PP6 may include a groove pattern GP. In an embodiment of the present disclosure, the groove pattern GP may have a groove shape recessed from one surface of the patterned glass PGd. The groove pattern GP may have a stripe shape extending in a direction parallel to the folding axis FX2 (for example, the first direction DR1).

Each of the first to sixth pattern portions PP1 to PP6 may include a bottom surface BS, a first inside surface ISS1, and a second inside surface ISS2 that define the groove pattern GP.

As illustrated in FIG. 11A, the first inside surface ISS1 and the second inside surface ISS2 may have symmetrical structures with respect to the bottom surface BS. The first inside surface ISS1 and the second inside surface ISS2 may have inclined structures tilted with respect to the bottom surface BS. The inclination angle of the first inside surface ISS1 with respect to the bottom surface BS may be the same as the inclination angle of the second inside surface ISS2 with respect to the bottom surface BS.

Meanwhile, as illustrated in FIG. 11B, the first inside surface ISS1 and the second inside surface ISS2 may have asymmetrical structures with respect to the bottom surface BS. In this case, the inclination angle of the first inside surface ISS1 with respect to the bottom surface BS may differ from the inclination angle of the second inside surface ISS2 with respect to the bottom surface BS. For example, the inclination angle of the first inside surface ISS1 located close to the folding axis FX2 may be greater than the inclination angle of the second inside surface ISS2 located far away from the folding axis FX2.

Folding stress applied to the folding portion FPd and folding stress applied between the folding portion FPd and the non-folding portions NFP1 and NFP2 may be reduced by adjusting the widths of the pattern portions PP1 to PP6 or the inclination angles of the inside surfaces of the pattern portions PP1 to PP6 as the distance from the folding axis FX2 increases.

Figure 12A:
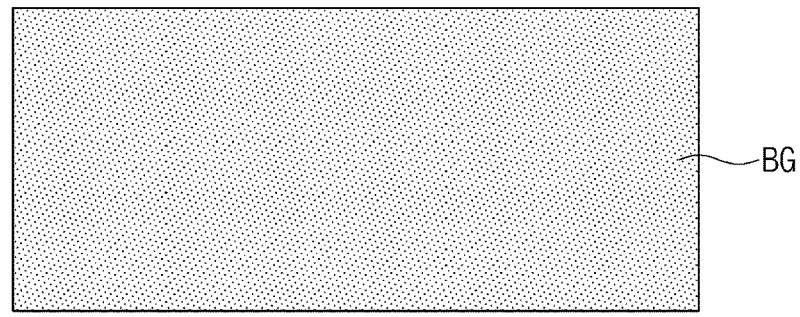
FIGS. 12A to 12C are process views illustrating various steps of a manufacturing process of a glass window according to an embodiment of the present disclosure.
Figure 12B:
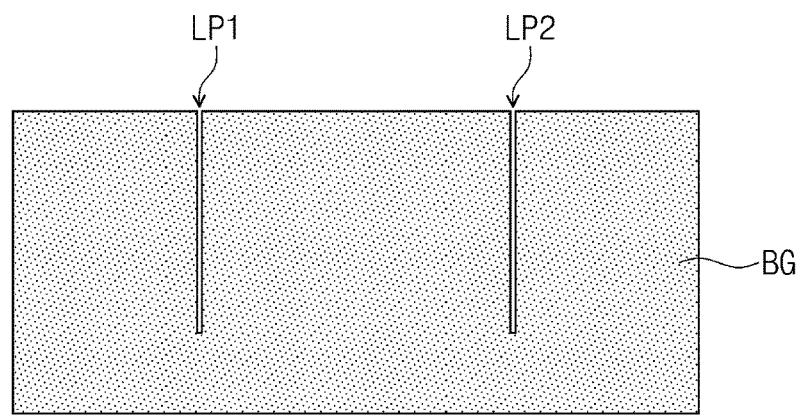
Figure 12C:
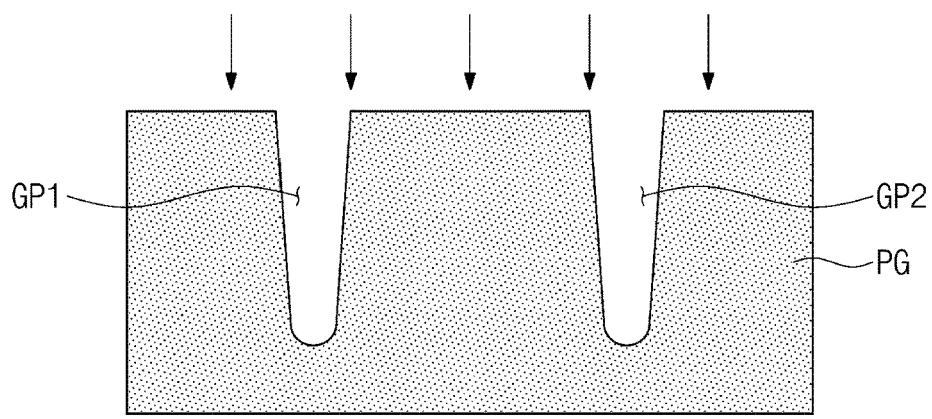
Figure 13A:
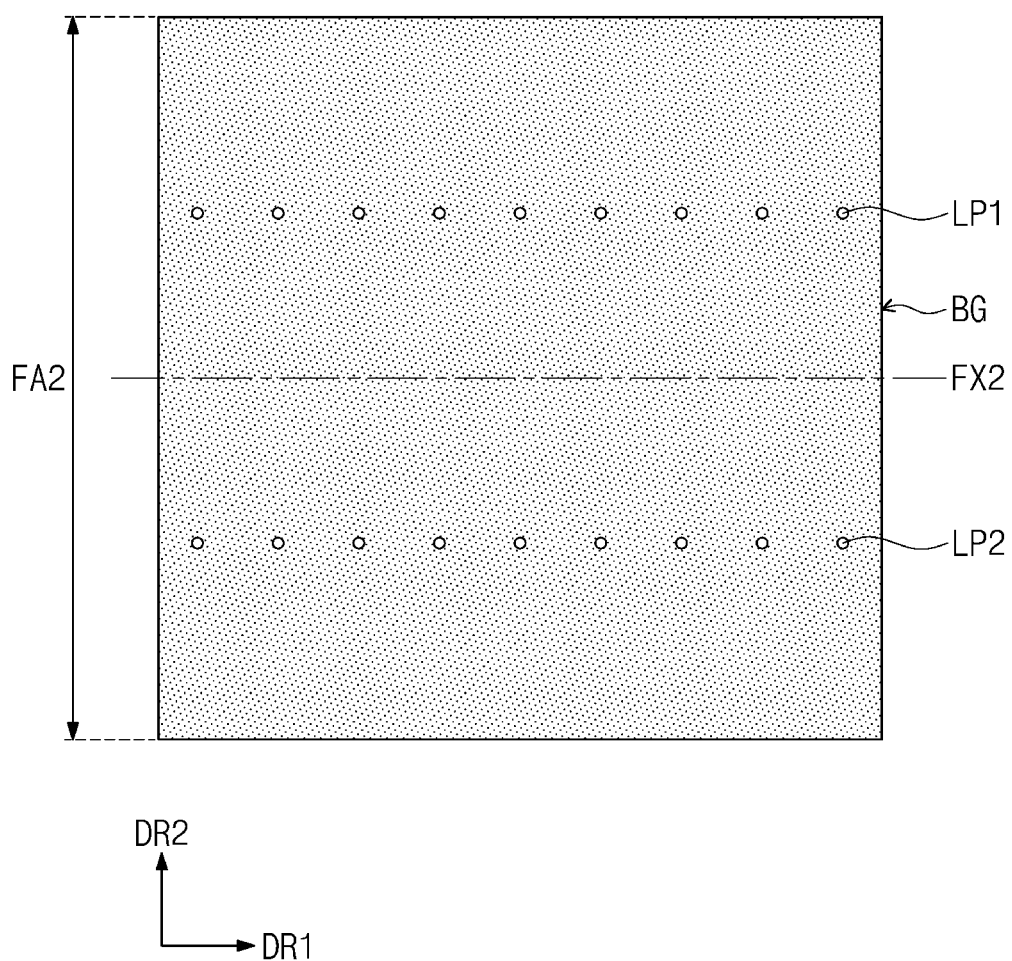
FIG. 13A is a plan view of the base glass manufactured through a process of FIG. 12B.
Figure 13B:
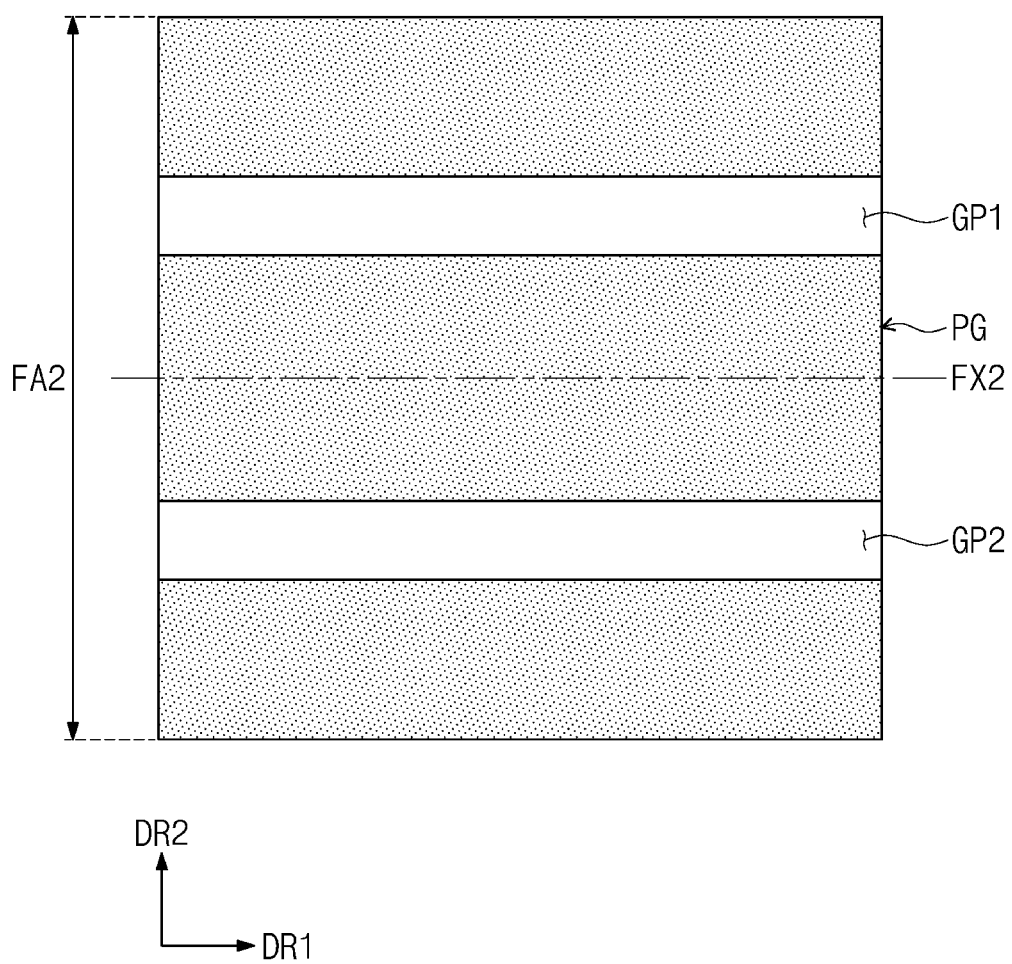
FIG. 13B is a plan view of the patterned glass manufactured through a process of FIG. 12C.

FIGS. 12A to 12C are process views illustrating a manufacturing process of a glass window according to an embodiment of the present disclosure. FIG. 13A is a plan view of a base glass manufactured through a process of FIG. 12B, and FIG. 13B is a plan view of a patterned glass manufactured through a process of FIG. 12C.

Referring to FIG. 5A, a method of manufacturing the display device DD includes a step of manufacturing the display module DM, a step of manufacturing the glass window WM, and a step of combining the display module DM and the glass window WM. When a functional layer (e.g., the anti-reflection layer RPL) is additionally disposed between the display module DM and the glass window WM, the glass window WM and the display module DM may be combined, with the functional layer interposed therebetween.

Hereinafter, a process of manufacturing the glass window WM will be described with reference to FIGS. 12A to 12C. For example, FIGS. 12A to 12C are cross-sectional views of the glass window WM for explaining a process of forming the pattern portions PP in the folding portion FP of the glass window WM to correspond to the folding area FA2.

Referring to FIG. 12A, base glass BG is prepared for manufacture of the glass window WM.

Referring to FIGS. 12A and 13A, laser patterns are formed by applying an ultrashort pulse laser to one surface of the base glass BG corresponding to the folding area FA2. Although first laser patterns LP1 and second laser patterns LP2 are illustrated in FIGS. 12A and 13A, laser patterns may be provided to correspond to the positions where the pattern portions PP of FIG. 5B are to be formed.

The first laser patterns LP1 are arranged along the first direction DR1 parallel to the folding axis FX2. The second laser patterns LP2 are spaced apart from the first laser patterns LP1 in the second direction DR2 and arranged along the first direction DR1. The first laser patterns LP1 and the second laser patterns LP2 may have a circular shape in a plan view.

The first laser patterns LP1 and the second laser patterns LP2 have a shape recessed from the one surface of the base glass BG. In an embodiment of the present disclosure, the first laser patterns LP1 and the second laser patterns LP2 may be cylindrical recesses.

The ultrashort pulse laser may be a picosecond laser or a femtosecond laser. The picosecond laser refers to a laser whose wavelength is in units of picoseconds, and the femtosecond laser refers to a laser whose wavelength is in units of femtoseconds. In formation of the first laser patterns LP1 and the second laser patterns LP2, the first laser patterns LP1 and the second laser patterns LP2 may be formed in a deep narrow recess form by using the ultrashort pulse laser. Furthermore, when the ultrashort pulse laser is used, a small impact may be applied to the base glass BG even though a laser process is performed, and therefore cracks might not be generated around the first laser patterns LP1 and the second laser patterns LP2.

Referring to FIGS. 12C and 13B, a patterned glass PG having a first groove pattern GP1 and a second groove pattern GP2 may be formed by etching the base glass BG having the first laser patterns LP1 and the second laser patterns LP2 formed therein. The first groove pattern GP1 and the second groove pattern GP2 may have a stripe shape extending in the first direction DR1. The first groove pattern GP1 and the second groove pattern GP2 may be spaced apart from each other in the second direction DR2.

An etchant, such as NaOH or KOH, may be used in the etching process of etching the base glass BG. When the etching process is performed using the etchant, the first laser patterns LP1 and the second laser patterns LP2 of the base glass BG may be anisotropically etched. As the base glass BG around the first laser patterns LP1 and the second laser patterns LP2 is etched, the first groove pattern GP1 and the second groove pattern GP2 having a stripe form may be formed.

When the etching process is completely performed, a process of strengthening the patterned glass PG may be performed. The compressive strength of the patterned glass PG may be increased by the strengthening process.

Referring to FIG. 5B, the filling layer FL may be formed on the completed patterned glass PG. The filling layer FL may be formed by a laminating method. However, a method of forming the filling layer FL is not necessarily limited to this approach.

FIG. 12B illustrates, as an embodiment of the present disclosure, a structure in which the laser patterns for forming each of the groove patterns GP1 and GP2 are formed in one row. However, the present disclosure is not necessarily limited thereto. The laser patterns may be provided in a plurality of rows depending on the width of each groove pattern.

Figure 14A:
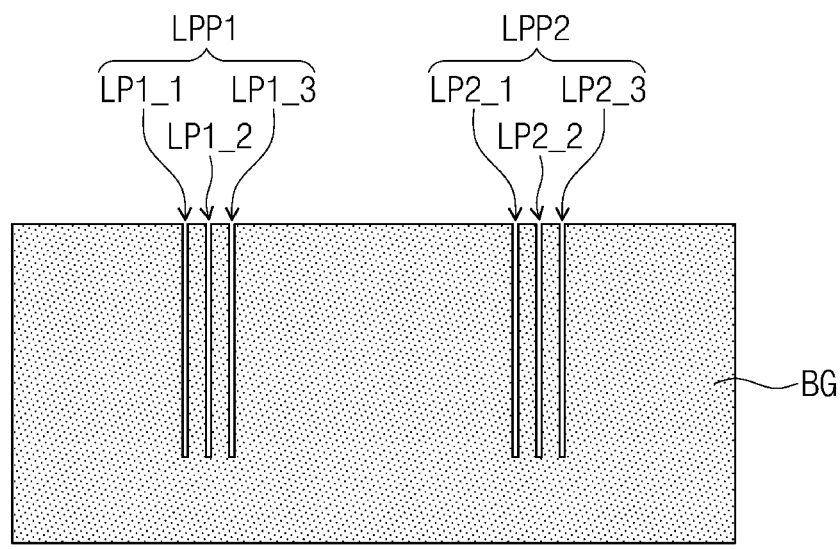
FIGS. 14A and 14B are process views illustrating various steps of a manufacturing process of a glass window according to an embodiment of the present disclosure.
Figure 14B:
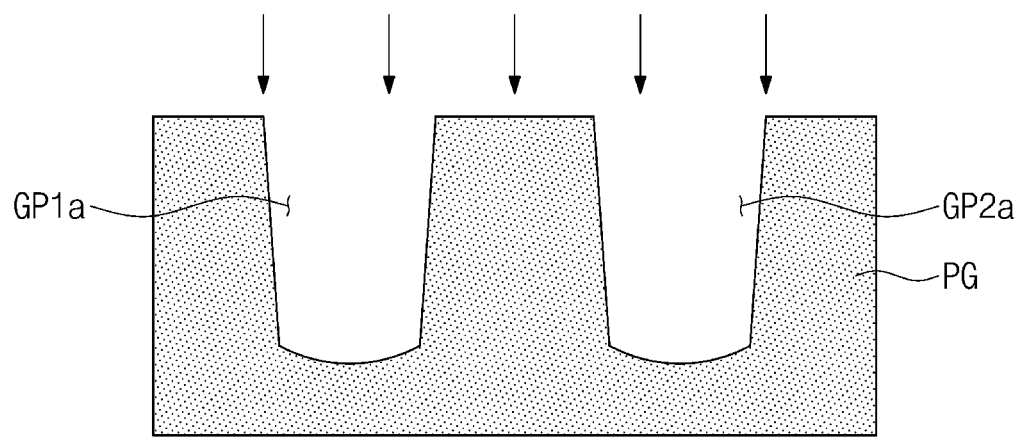
Figure 15A:
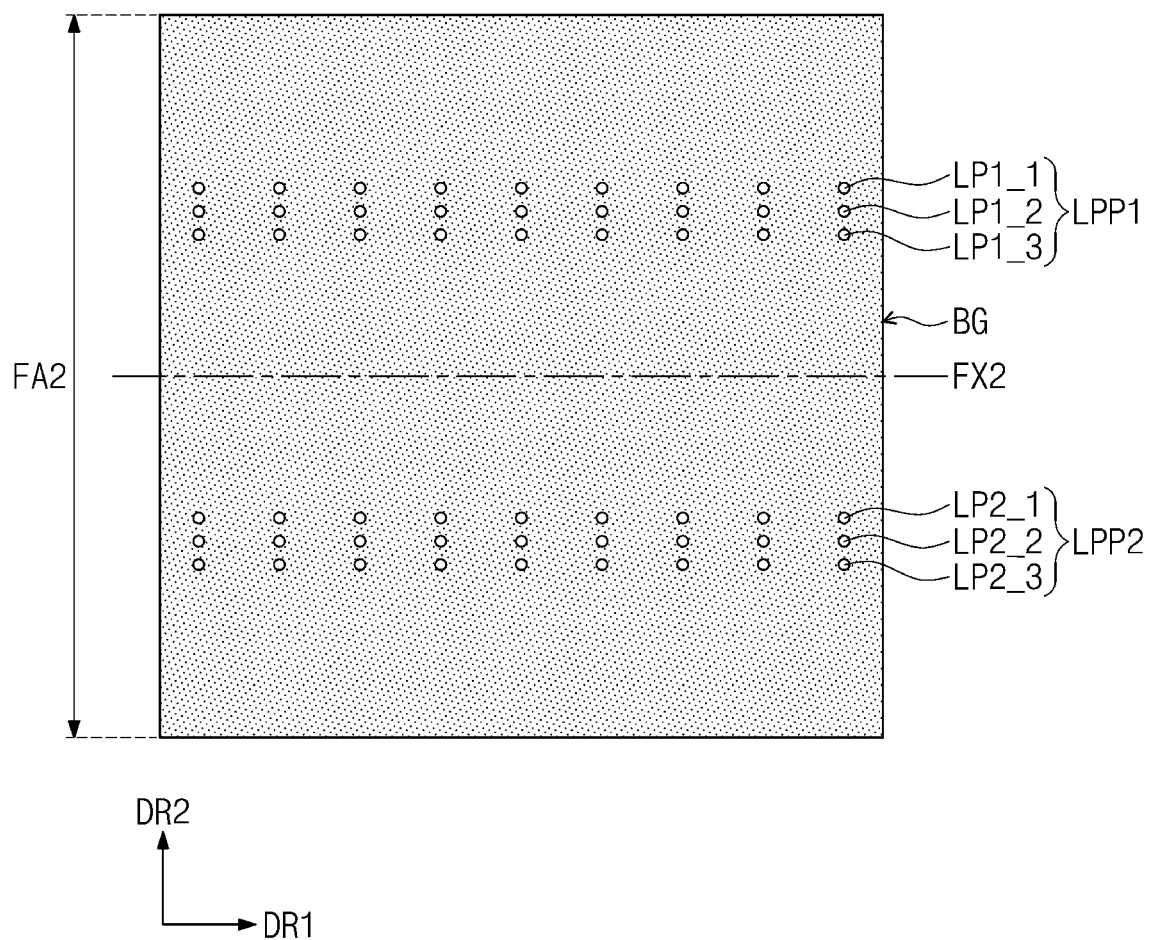
FIG. 15A is a plan view of the base glass manufactured through a process of FIG. 14A.
Figure 15B:
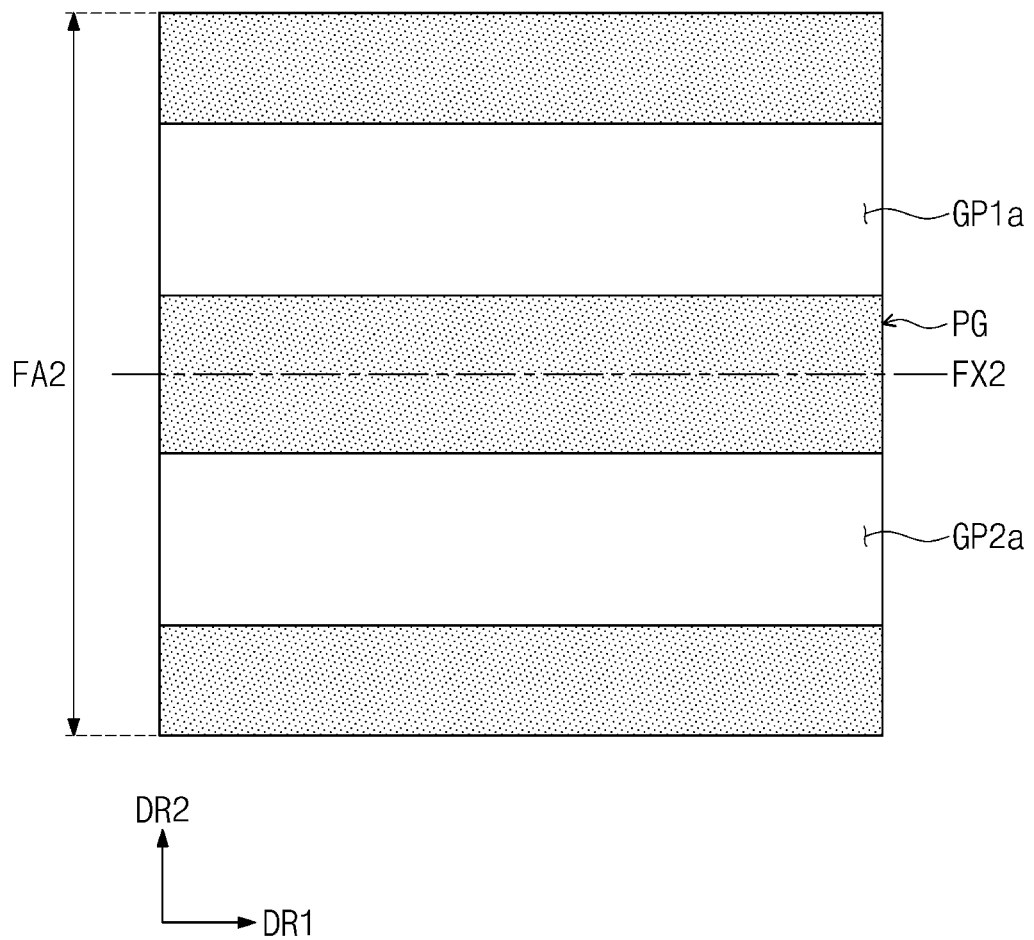
FIG. 15B is a plan view of the patterned glass manufactured through a process of FIG. 14B.

FIGS. 14A and 14B are process views illustrating a manufacturing process of a glass window according to an embodiment of the present disclosure. FIG. 15A is a plan view of a base glass manufactured through a process of FIG. 14A, and FIG. 15B is a plan view of a patterned glass manufactured through a process of FIG. 14B.

Referring to FIGS. 14A and 15A, a first laser pattern portion LPP1 and a second laser pattern portion LPP2 are formed by applying an ultrashort pulse laser to one surface of the base glass BG corresponding to the folding area FA2. The first laser pattern portion LPP1 and the second laser pattern portion LPP2 are spaced apart from each other at a predetermined interval in the second direction DR2.

The first laser pattern portion LPP1 may include a first row of laser patterns LP1_1, a second row of laser patterns LP1_2, and a third row of laser patterns LP1_3. The first row of laser patterns LP1_1 are spaced apart from each other in the first direction DR1. The second row of laser patterns LP1_2 are spaced apart from each other in the first direction DR1. The third row of laser patterns LP1_3 are spaced apart from each other in the first direction DR1. The first row of laser patterns LP1_1, the second row of laser patterns LP1_2, and the third row of laser patterns LP1_3 are spaced apart from each other in the second direction DR2.

The second laser pattern portion LPP2 may include a first row of laser patterns LP2_1, a second row of laser patterns LP2_2, and a third row of laser patterns LP2_3. The first row of laser patterns LP2_1 are spaced apart from each other in the first direction DR1. The second row of laser patterns LP2_2 are spaced apart from each other in the first direction DR1. The third row of laser patterns LP2_3 are spaced apart from each other in the first direction DR1. The first row of laser patterns LP2_1, the second row of laser patterns LP2_2, and the third row of laser patterns LP2_3 are spaced apart from each other in the second direction DR2.

Referring to FIGS. 14B and 15B, the patterned glass PG having a third groove pattern GP1*a* and a fourth groove pattern GP2*a* may be formed by etching the base glass BG having the first laser pattern portion LPP1 and the second laser pattern portion LPP2 formed therein. The third groove pattern GP1a and the fourth groove pattern GP2a may have a larger width than the first groove pattern GP1 and the second groove pattern GP2 illustrated in FIGS. 12C and 13B. For example, the number of rows included in a laser pattern portion may be set depending on the width of each groove pattern to be formed.

Figure 16A:
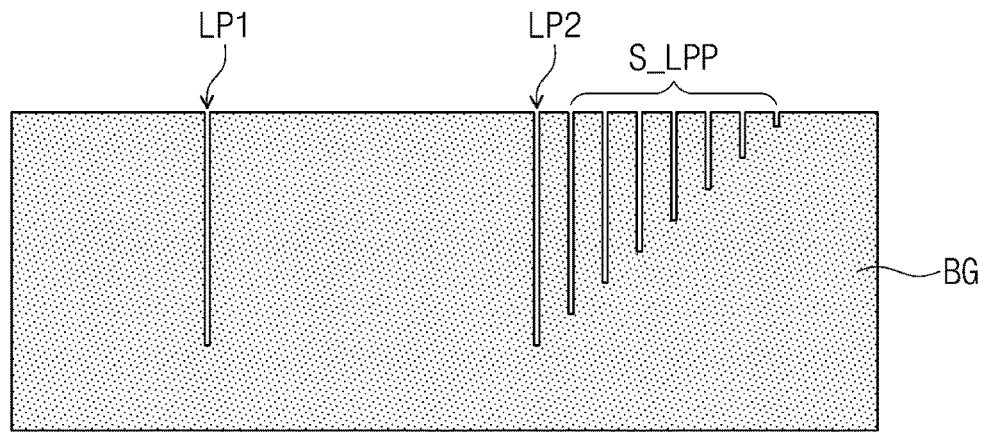
FIGS. 16A and 16B are process views illustrating various steps of a manufacturing process of a glass window according to an embodiment of the present disclosure.
Figure 16B:
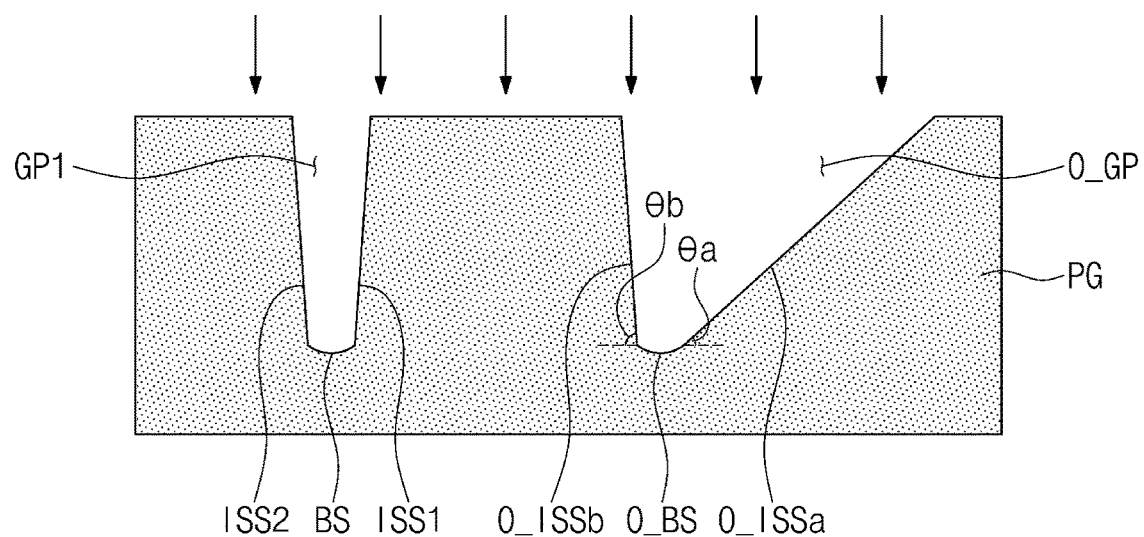
Figure 17A:
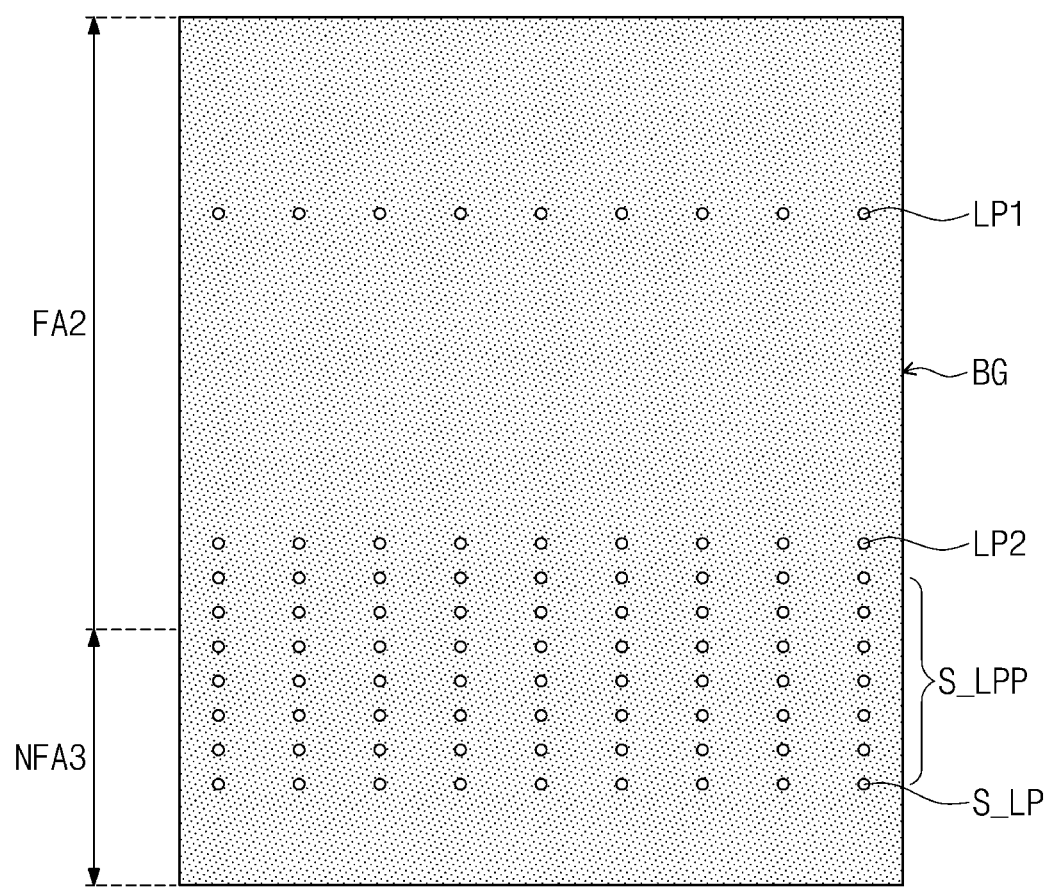
FIG. 17A is a plan view of the base glass manufactured through a process of FIG. 16A.
Figure 17B:
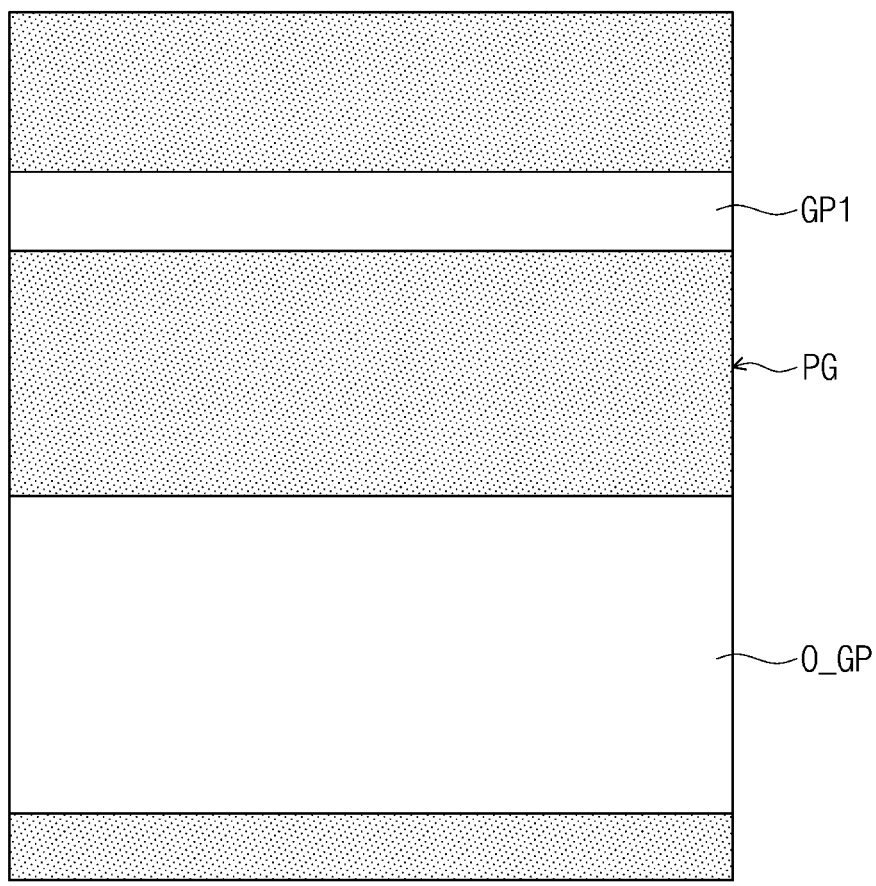
FIG. 17B is a plan view of the patterned glass manufactured through a process of FIG. 16B.

FIGS. 16A and 16B are process views illustrating a manufacturing process of a glass window according to an embodiment of the present disclosure. FIG. 17A is a plan view of a base glass manufactured through a process of FIG. 16A, and FIG. 17B is a plan view of a patterned glass manufactured through a process of FIG. 16B.

Referring to FIGS. 16A and 17A, first laser patterns LP1 and second laser patterns LP2 are formed by applying an ultrashort pulse laser to one surface of the base glass BG corresponding to the folding area FA2. When the second laser patterns LP2 are the outermost laser patterns adjacent to the non-folding portion NFP1 or NFP2 (refer to FIG. 5B), a sub-laser pattern portion S_LPP may be additionally formed adjacent to the second laser patterns LP2.

The sub-laser pattern portion S_LPP may include a plurality of sub-laser patterns S_LP having different depths. The depths of the sub-laser patterns S_LP may gradually decrease farther away from the folding axis FX2. The depths of the sub-laser patterns S_LP may be adjusted by using the duration time or intensity of an ultrashort pulse laser.

Some of the sub-laser patterns S_LP may at least partially overlap the folding area FA2, and the other sub-laser patterns S_LP may at least partially overlap the non-folding area NFA3.

Referring to FIGS. 16B and 17B, the patterned glass PG having a first groove pattern GP1 and an outermost groove pattern O_GP may be formed by etching the base glass BG having the first laser patterns LP1, the second laser patterns LP2, and the sub-laser patterns S_LP formed therein. The outermost groove pattern O_GP may have a larger width than the first groove pattern GP1.

The patterned glass PG includes a bottom surface BS, a first inside surface ISS1, and a second inside surface ISS2 that define the first groove pattern GP1. The patterned glass PG includes an outermost bottom surface O_BS, a first outermost inside surface O_ISSa, and a second outermost inside surface O_ISSb that define the outermost groove pattern O_GP. The first inside surface ISS1 and the second inside surface ISS2 have symmetrical shapes with respect to the bottom surface BS. The first outermost inside surface O_ISSa and the second outermost inside surface O_ISSb have asymmetrical structures with respect to the outermost bottom surface O_BS. For example, the inclination angle θa of the first outermost inside surface O_ISSa with respect to the outermost bottom surface O_BS may be smaller than the inclination angle θb of the second outermost inside surface O_ISSb with respect to the outermost bottom surface O_BS. The inclination angle θa of the first outermost inside surface O_ISSa may range from about 40 degrees to about 70 degrees, and the inclination angle θb of the second outermost inside surface O_ISSb may range from about 70 degrees to about 90 degrees. However, the magnitudes of the inclination angles θa and θb are not necessarily limited to the examples set forth herein.

Figure 18A:
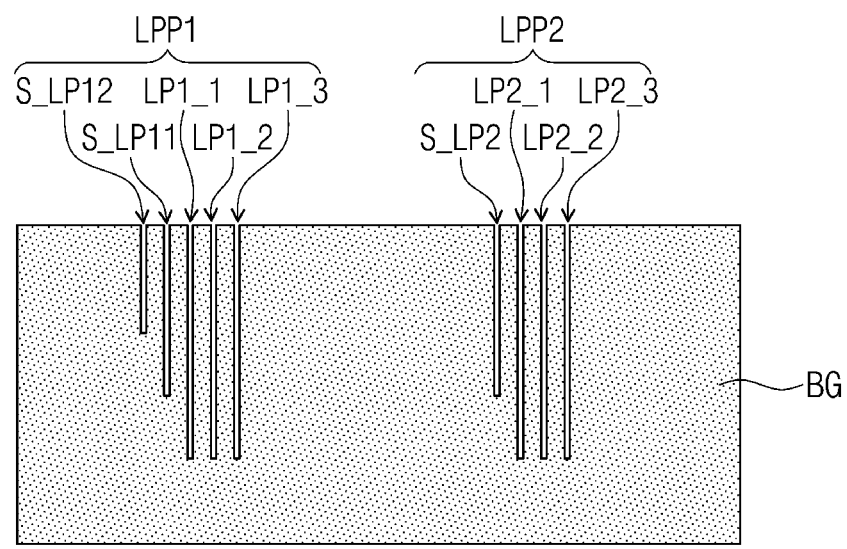
FIGS. 18A and 18B are process views illustrating various steps of a manufacturing process of a glass window according to an embodiment of the present disclosure.
Figure 18B:
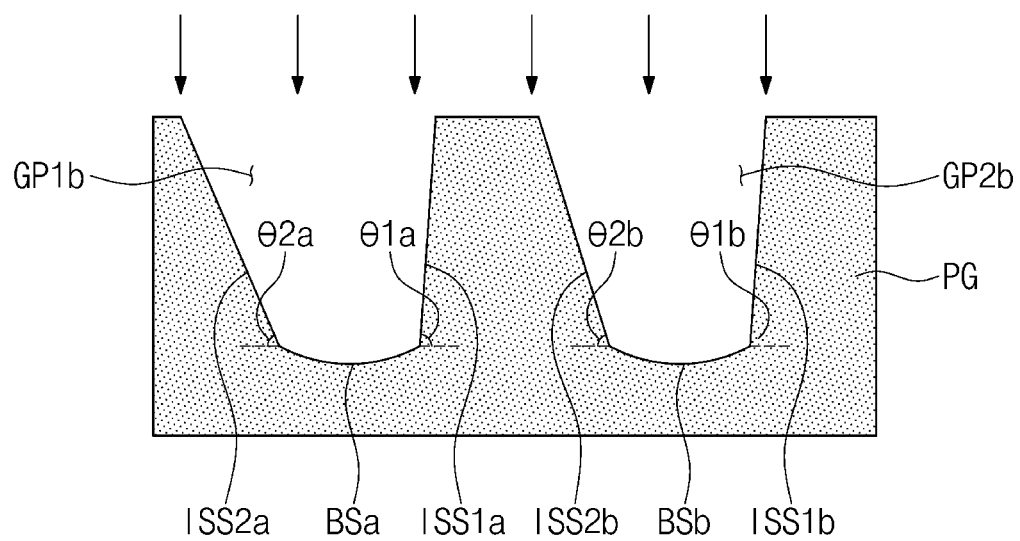
Figure 19A:
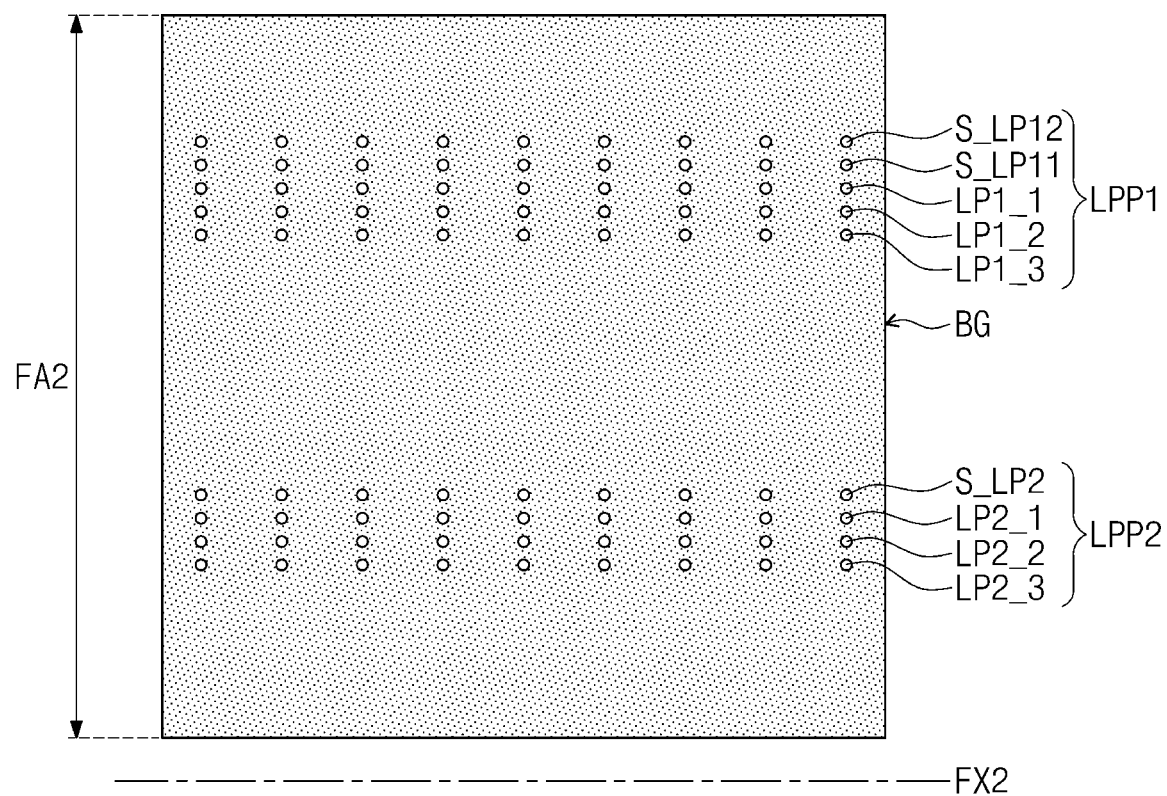
FIG. 19A is a plan view of the base glass manufactured through a process of FIG. 18A.
Figure 19B:
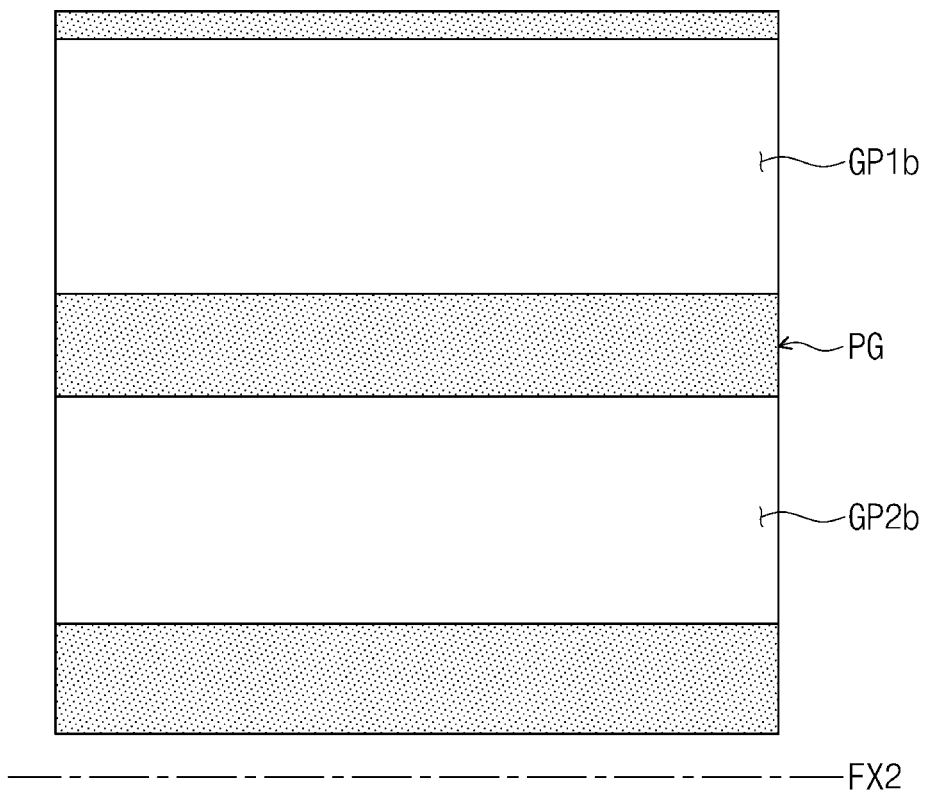
FIG. 19B is a plan view of the patterned glass manufactured through a process of FIG. 18B.

FIGS. 18A and 18B are process views illustrating a manufacturing process of a glass window according to an embodiment of the present disclosure. FIG. 19A is a plan view of a base glass manufactured through a process of FIG. 18A, and FIG. 19B is a plan view of a patterned glass manufactured through a process of FIG. 18B.

Referring to FIGS. 18A and 19A, a first laser pattern portion LPP1 and a second laser pattern portion LPP2 are formed by applying an ultrashort pulse laser to one surface of the base glass BG corresponding to the folding area FA2. The first laser pattern portion LPP1 and the second laser pattern portion LPP2 are spaced apart from each other at a predetermined interval in the second direction DR2.

The first laser pattern portion LPP1 may include a first row of laser patterns LP1_1, a second row of laser patterns LP1_2, and a third row of laser patterns LP1_3. The first laser pattern portion LPP1 may further include a first row of sub-laser patterns S_LP11 and a second row of sub-laser patterns S_LP12. The first row of sub-laser patterns S_LP11 and the second row of sub-laser patterns S_LP12 may be provided adjacent to the first row of laser patterns LP1_1 and might not be provided on one side of the third row of laser patterns LP1_3.

The second laser pattern portion LPP2 may include a first row of laser patterns LP2_1, a second row of laser patterns LP2_2, and a third row of laser patterns LP2_3. The second laser pattern portion LPP2 may further include a first row of sub-laser patterns S_LP2. The first row of sub-laser patterns S_LP2 may be provided adjacent to the first row of laser patterns LP2_1 and might not be provided on one side of the third row of laser patterns LP2_3.

Referring to FIGS. 18B and 19B, the patterned glass PG having a first groove pattern GP1b and a second groove pattern GP2b may be formed by etching the base glass BG having the first laser patterns LP1, the second laser patterns LP2, and the sub-laser patterns S_LP formed therein. The first groove pattern GP1b may have a larger width than the second groove pattern GP2b.

The patterned glass PG includes a first bottom surface BSa, a first inside surface ISS1a, and a second inside surface ISS2a that define the first groove pattern GP1b. The patterned glass PG includes a second bottom surface BSb, a third inside surface ISS1b, and a fourth inside surface ISS2b that define the second groove pattern GP2b. The first inside surface ISS1a and the second inside surface ISS2a have asymmetrical shapes with respect to the first bottom surface BSa. For example, the inclination angle θ1a of the first inside surface ISS1a with respect to the first bottom surface BSa is greater than the inclination angle θ2a of the second inside surface ISS2a with respect to the first bottom surface BSa. The inclination angle θ1b of the third inside surface ISS1b with respect to the second bottom surface BSb is greater than the inclination angle θ2b of the fourth inside surface ISS2b with respect to the second bottom surface BSb. Furthermore, the inclination angle θ1b of the third inside surface ISS1b with respect to the second bottom surface BSb may differ from the inclination angle θ1a of the first inside surface ISS1a with respect to the first bottom surface BSa. In an embodiment of the present disclosure, the inclination angle θ1a of the first inside surface ISS1a may be smaller than the inclination angle θ1b of the third inside surface ISS1b.

As described above, the inclination angles of the inside surfaces defining each of the groove patterns GP1b and GP2b may be adjusted by adjusting the number and depth of sub-laser patterns included in each of the laser pattern portions LPP1 and LPP2.

According to embodiments of the present disclosure, the glass window includes the patterned glass including the pattern portion having the groove pattern provided on one surface of the patterned glass to correspond to the folding area and the non-pattern portion disposed adjacent to the pattern portion to correspond to the folding area. The pattern portion may have a thickness smaller than or equal to one-half the thickness of the non-pattern portion. Accordingly, folding stress of the glass window in the folding area may be decreased, and the impact resistance of the glass window may be increased.

While the present disclosure has been described with reference to various embodiments thereof, it will be apparent to those of ordinary skill in the art that various changes and modifications may be made thereto without departing from the spirit and scope of the present disclosure.

What is claimed is:

1. A display device, comprising:
   a folding area foldable about a folding axis and a non-folding area proximate to the folding area;
   a display module configured to display an image; and
   a glass window disposed over the display module, the glass window including a patterned glass,
   wherein the patterned glass includes:
      a pattern portion including a groove pattern provided on a first surface of the patterned glass and corresponding to the folding area; and
      a non-pattern portion disposed proximate to the pattern portion and corresponding to the folding area,
   wherein the pattern portion has a thickness that is smaller than or equal to one-half a thickness of the non-pattern portion,
   wherein the groove pattern extends from the first surface of the patterned glass toward a second surface of the patterned glass and has a first width at first portion adjacent to the second surface and a second width at a second portion adjacent to the first surface, and
   wherein the thickness of the pattern portion is smaller than the first width of the groove pattern.

2. The display device of claim 1, wherein the pattern portion includes a plurality of pattern portions, and
   wherein the plurality of pattern portions extend in a first direction that is parallel to the folding axis and are spaced apart from each other in a second direction that is perpendicular to the first direction.

3. The display device of claim 2, wherein the plurality of pattern portions are spaced apart from each other at constant intervals, and
   wherein groove patterns included in the plurality of pattern portions, respectively, have constant widths across their entire length.

4. The display device of claim 2, wherein the plurality of pattern portions are spaced apart from each other at constant intervals, and
   wherein groove patterns included in the plurality of pattern portions, respectively, have different widths from one another.

5. The display device of claim 4, wherein the widths of the groove patterns vary without recognizable pattern in the second direction.

6. The display device of claim 4, wherein the groove patterns have widths that are different from one another and correspond to their distances from the folding axis.

7. The display device of claim 6, wherein each of the plurality of pattern portions includes a bottom surface, a first inside surface, and a second inside surface defining each of the groove patterns, and
   wherein the first inside surface and the second inside surface have different inclination angles with respect to the bottom surface.

8. The display device of claim 2, wherein the pattern portions of the plurality of pattern portions are spaced apart from each other at different intervals, and
   wherein groove patterns included in the plurality of pattern portions, respectively, have constant widths along their entire lengths.

9. The display device of claim 8, wherein the intervals between the pattern portions of the plurality of pattern portions vary without recognizable pattern in the second direction.

10. The display device of claim 2, wherein the patterned glass further includes an outermost pattern portion of the plurality of pattern portions that is farthest from the folding axis in the second direction,
    wherein the outermost pattern portion includes an outermost bottom surface, a first outermost inside surface, and a second outermost inside surface defining an outermost groove pattern, and
    wherein the first outermost inside surface and the second outermost inside surface have different inclination angles with respect to the outermost bottom surface.

11. The display device of claim 10, wherein a distance between the folding axis and the first outermost inside surface is greater than a distance between the folding axis and the second outermost inside surface, and
    wherein the first outermost inside surface has a smaller inclination angle than the second outermost inside surface.

12. The display device of claim 2, wherein the pattern portions of the plurality of pattern portions are spaced apart from each other at different intervals, and
    wherein groove patterns included in the plurality of pattern portions, respectively, have different widths.

13. The display device of claim 1, wherein the glass window further includes a filling layer disposed on the first surface of the patterned glass.

14. The display device of claim 1, wherein the groove pattern has a shape recessed from the one surface of the patterned glass and has a stripe shape.

* * * * *